United States Patent
Kim

(10) Patent No.: US 9,305,855 B2
(45) Date of Patent: Apr. 5, 2016

(54) SEMICONDUCTOR PACKAGE DEVICES INCLUDING INTERPOSER OPENINGS FOR HEAT TRANSFER MEMBER

(71) Applicant: Sang-Uk Kim, Cheonan-si (KR)

(72) Inventor: Sang-Uk Kim, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/448,794

(22) Filed: Jul. 31, 2014

(65) Prior Publication Data

US 2015/0115466 A1 Apr. 30, 2015

(30) Foreign Application Priority Data

Oct. 29, 2013 (KR) ........................ 10-2013-0129370

(51) Int. Cl.
| | |
|---|---|
| *H01L 23/34* | (2006.01) |
| *H01L 23/28* | (2006.01) |
| *H01L 23/538* | (2006.01) |
| *H01L 23/498* | (2006.01) |

(Continued)

(52) U.S. Cl.
CPC ................ *H01L 23/28* (2013.01); *H01L 23/13* (2013.01); *H01L 23/3128* (2013.01); *H01L 23/49811* (2013.01); *H01L 23/49838* (2013.01); *H01L 23/5384* (2013.01); *H01L 23/5385* (2013.01); *H01L 25/10* (2013.01); *H01L 23/42* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73253* (2013.01); *H01L 2224/73265* (2013.01); *H01L 2924/15311* (2013.01)

(58) Field of Classification Search
CPC ..... H01L 23/34; H01L 23/5384; H01L 23/28; H01L 25/10; H01L 34/49838; H01L 23/49811; H01L 2924/15311; H01L 23/42; H01L 2224/73253; H01L 2224/48227; H01L 1114/48091; H01L 2224/32225; H01L 2224/16225; H01L 2224/48091; H01L 2924/00014; H01L 2224/73265; H01L 3335/32225
USPC ......... 257/774, 773, 686, 685, 777, 723, 778, 257/738, 737, 734
See application file for complete search history.

(56) References Cited

U.S. PATENT DOCUMENTS

| 5,656,856 A | 8/1997 | Kweon |
| 6,084,311 A | 7/2000 | Jiang et al. |

(Continued)

FOREIGN PATENT DOCUMENTS

| KR | 93-010752 B1 | 4/1994 |
| KR | 2001-0073536 | 8/2001 |

(Continued)

*Primary Examiner* — Alexander Oscar Williams
(74) *Attorney, Agent, or Firm* — Myers Bigel & Sibley, P.A.

(57) ABSTRACT

A semiconductor package device includes a lower package, an interposer disposed on the lower package and including a ground layer and at least one opening, and an upper package on the interposer. The lower package includes a first package substrate, a first semiconductor chip on the first package substrate, and a first molding compound layer on the first package substrate. The upper package includes a second package substrate and at least one upper semiconductor chip on the second package substrate. A heat transfer member includes a first portion disposed between the interposer and the upper package, a second portion disposed in the at least one opening of the interposer, and a third portion disposed between the interposer and the lower package.

24 Claims, 25 Drawing Sheets

(51) Int. Cl.
*H01L 25/10* (2006.01)
*H01L 23/13* (2006.01)
*H01L 23/31* (2006.01)
*H01L 23/42* (2006.01)

(56) References Cited

U.S. PATENT DOCUMENTS

| | | | |
|---|---|---|---|
| 6,535,981 B1* | 3/2003 | Shimizu | 726/26 |
| 7,023,084 B2 | 4/2006 | Tomabechi et al. | |
| 7,642,656 B2* | 1/2010 | Yoo et al. | 257/777 |
| 7,856,804 B2 | 12/2010 | Laming et al. | |
| 8,217,502 B2* | 7/2012 | Ko | 257/686 |
| 8,304,296 B2* | 11/2012 | Ko et al. | 438/124 |
| 8,314,493 B2* | 11/2012 | Kikuchi et al. | 257/738 |
| 8,338,945 B2 | 12/2012 | Yu et al. | |
| 8,432,028 B2* | 4/2013 | Kim et al. | 257/686 |
| 2003/0223181 A1 | 12/2003 | Moden et al. | |
| 2004/0178508 A1* | 9/2004 | Nishimura et al. | 257/778 |
| 2005/0287716 A1 | 12/2005 | Moden et al. | |
| 2006/0175696 A1* | 8/2006 | Kim | 257/686 |
| 2007/0108583 A1* | 5/2007 | Shim et al. | 257/686 |
| 2009/0166834 A1* | 7/2009 | Yoon et al. | 257/686 |
| 2009/0174081 A1* | 7/2009 | Furuta | 257/777 |
| 2009/0236718 A1* | 9/2009 | Yang et al. | 257/686 |
| 2009/0261465 A1* | 10/2009 | Shinagawa | 257/686 |
| 2010/0289130 A1* | 11/2010 | Fjelstad | 257/686 |
| 2011/0018115 A1* | 1/2011 | Takahashi | 257/686 |
| 2011/0140283 A1* | 6/2011 | Chandra et al. | 257/777 |
| 2012/0126400 A1 | 5/2012 | Lee | |
| 2012/0159118 A1* | 6/2012 | Wong et al. | 712/1 |

FOREIGN PATENT DOCUMENTS

| | | |
|---|---|---|
| KR | 10-2012-0053675 | 5/2012 |
| KR | 10-1227735 B1 | 11/2012 |
| KR | 10-2013-0038581 A | 4/2013 |

* cited by examiner

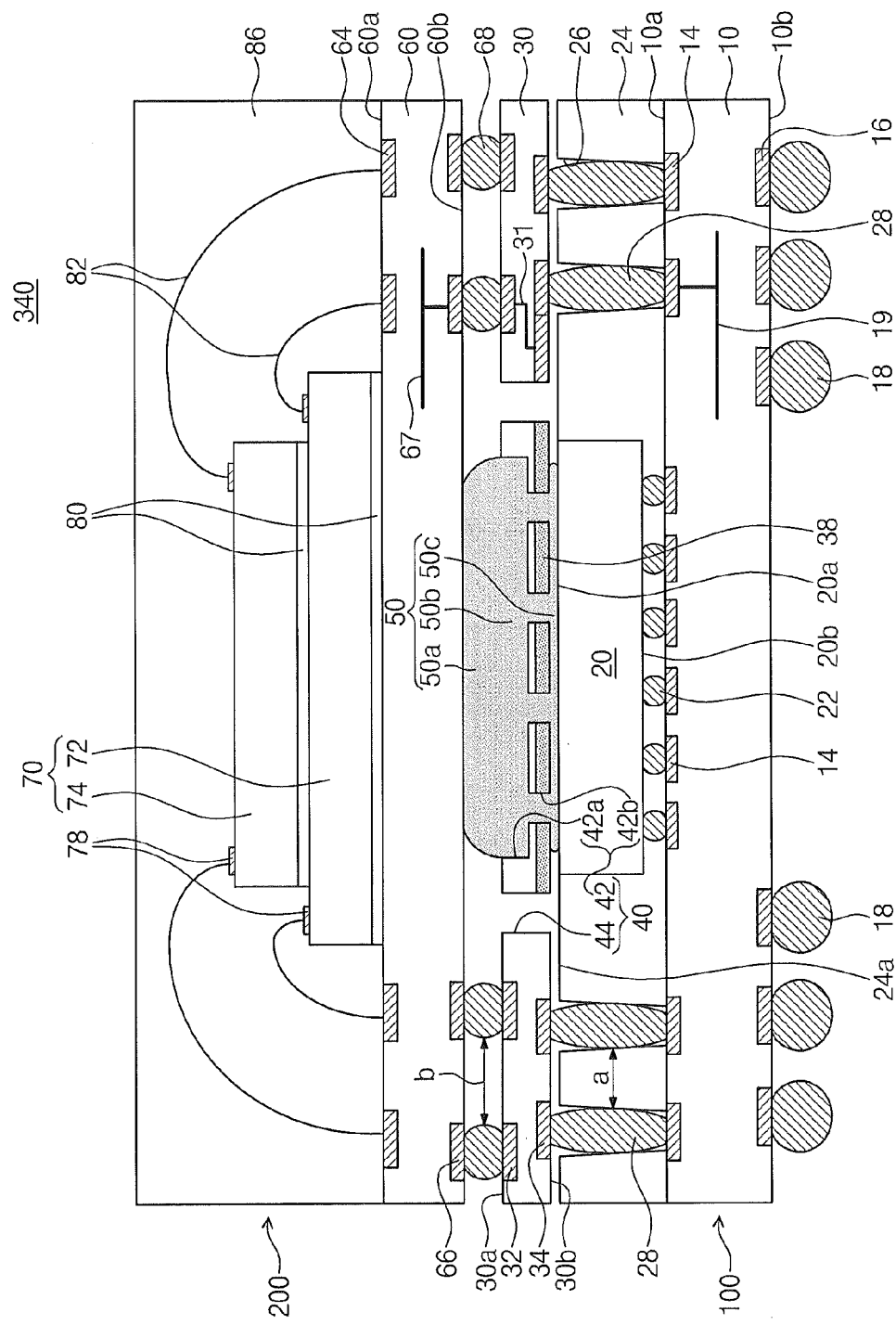

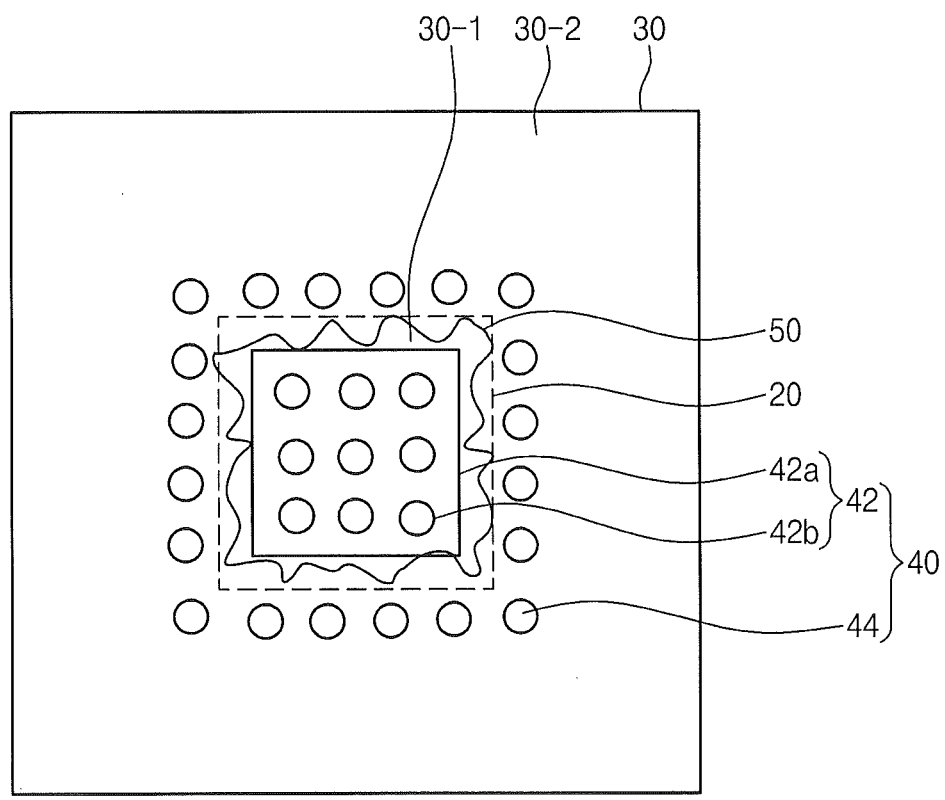

SEMICONDUCTOR PACKAGE DEVICES INCLUDING INTERPOSER OPENINGS FOR HEAT TRANSFER MEMBER

CROSS-REFERENCE TO RELATED APPLICATION

This U.S. non-provisional patent application claims priority under 35 U.S.C. §119 to Korean Patent Application No. 10-2013-0129370, filed on Oct. 29, 2013, in the Korean Intellectual Property Office, the disclosure of which is hereby incorporated by reference in its entirety.

BACKGROUND

The inventive concepts relate to semiconductor devices and, more particularly, to package-on-package devices.

High performance, high speed and small electronic components have been demanded with the development of an electronic industry. For example, as the use of small and thin communication devices (e.g., mobile phones or tablet personal computers) is increasing, smaller and thinner semiconductor packages included therein are increasingly demanded. New packaging techniques are being suggested to satisfying these trends. The new packaging techniques may include a technique of stacking semiconductor chips on one package substrate and a technique of stacking a package on another package. Particularly, package-on-package (PoP) devices including stacked packages are being spotlighted. Thus, it is increasingly desired to improve reliability of the PoP devices.

SUMMARY

Embodiments of the inventive concepts may provide semiconductor package devices capable of improving a heat release effect.

Embodiments of the inventive concepts may also provide semiconductor package devices capable of reducing or preventing interference with respect to electrical signals, which is caused by a heat transfer member.

In one aspect, a semiconductor package device may include: a lower package including a first package substrate, a first semiconductor chip on the first package substrate, and a first molding compound layer on the first package substrate; an interposer disposed on the lower package, the interposer including at least one opening; an upper package disposed on the interposer, the upper package including a second package substrate and a second semiconductor chip on the second package substrate; a heat transfer member disposed between the interposer and the upper package, between the interposer and the lower package, and in the at least one opening of the interposer; first via-connecting terminals connecting the lower package to the interposer, the first via-connecting terminals spaced apart from each other with a first distance therebetween; and second via-connecting terminals connecting the interposer to the upper package, the second via-connecting terminals spaced apart from each other with a second distance therebetween that is different from the first distance.

In another aspect, a semiconductor package device may include: a first package including a first package substrate, a first semiconductor chip on the first package substrate, and a first molding compound layer on the first package substrate; an interposer disposed on the first package, the interposer including a ground layer and at least one opening; a second package including a second package substrate disposed on the interposer, and a second semiconductor chip on the second package substrate; and a heat transfer member including a first portion disposed between the interposer and the second package, a second portion disposed in the at least one opening of the interposer, and a third portion disposed between the interposer and the first package. The heat transfer member may be connected to the ground layer of the interposer.

In still another aspect, a semiconductor package device may include: a first package including a first package substrate; an interposer disposed on the first package, the interposer including a ground layer and at least one opening; a second package disposed on the interposer, the second package including a second package substrate; and a heat transfer member including a first portion disposed between the interposer and the second package, a second portion disposed in the at least one opening of the interposer, and a third portion disposed between the interposer and the first package.

In yet another aspects, a semiconductor package device may include: a first semiconductor package; a second semiconductor package; an interposer between the first and second semiconductor packages that electrically interconnects the first and second semiconductor packages, the interposer including an opening therein; and a flowable heat transfer member that is disposed between the interposer and the first semiconductor package and between the interposer and the second semiconductor package. The flowable heat transfer member and the opening are configured to flow some of the flowable heat transfer member into the opening in response to heating of the flowable heat transfer member. In some embodiments, the interposer includes a ground layer; the flowable heat transfer member is electrically conductive; and ground layer is electrically connected to the flowable heat transfer member. Moreover, in some embodiments, the opening is adjacent an edge of the flowable heat transfer member when the flowable heat transfer member is not heated by the first and second semiconductor packages.

BRIEF DESCRIPTION OF THE DRAWINGS

The inventive concepts will become more apparent in view of the attached drawings and accompanying detailed description.

FIG. 7A is a cross-sectional view illustrating a semiconductor package device according to yet other embodiments of the inventive concepts;

FIGS. 7B and 7C are plan views illustrating modified examples of a design of an interposer, on which a heat transfer member is disposed, in the semiconductor package device illustrated in FIG. 7A;

DETAILED DESCRIPTION OF THE EMBODIMENTS

Figure 1A:
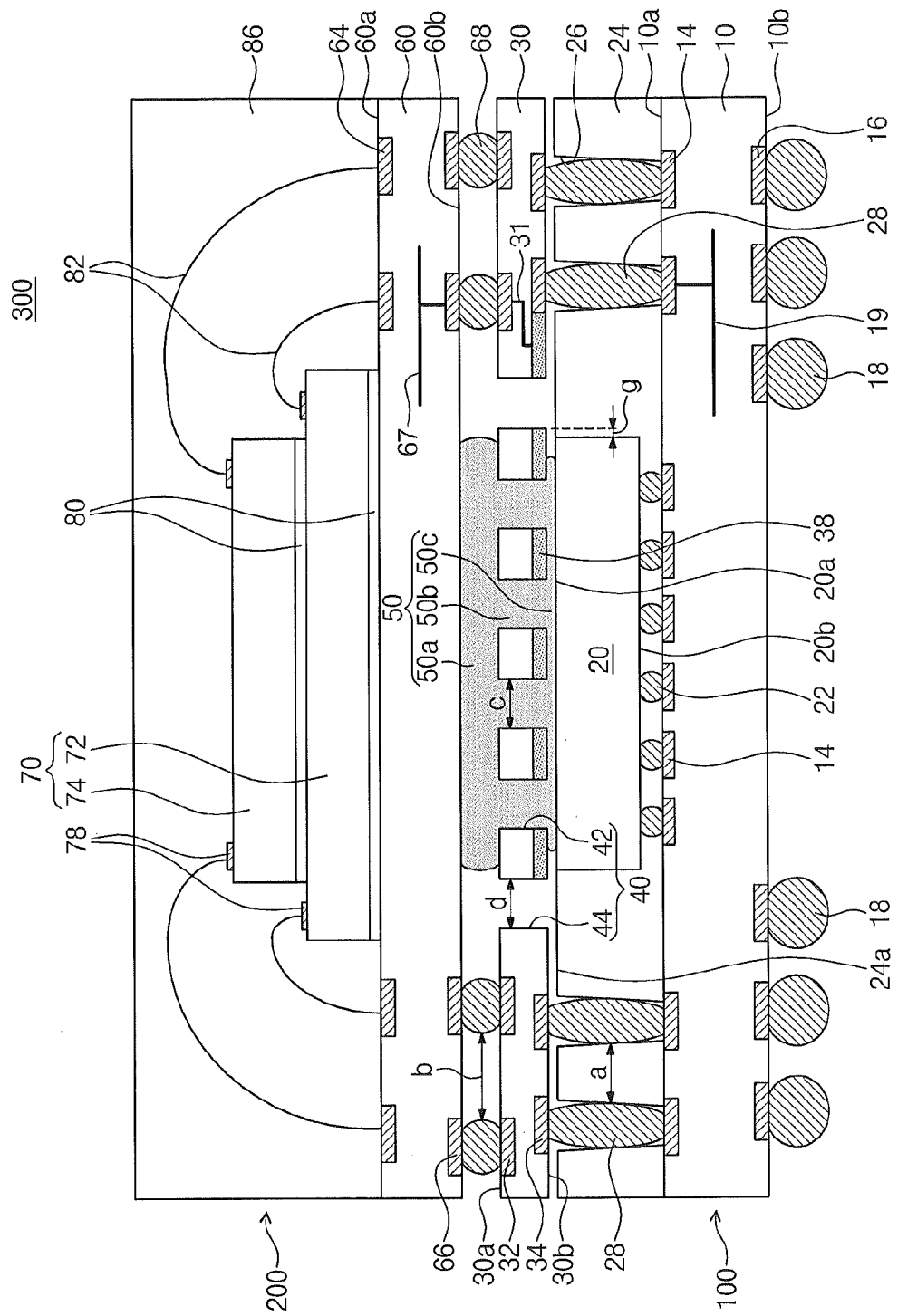
FIG. 1A is a cross-sectional view illustrating a semiconductor package device according to some embodiments of the inventive concepts.

The inventive concepts will now be described more fully hereinafter with reference to the accompanying drawings, in which embodiments of the inventive concepts are shown. The advantages and features of the inventive concepts and methods of achieving them will be apparent from the following embodiments that will be described in more detail with reference to the accompanying drawings. It should be noted, however, that the inventive concepts are not limited to the following embodiments, and may be implemented in various forms. Accordingly, the embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal views of the inventive concepts. Accordingly, shapes of the views may be modified according to manufacturing techniques and/or allowable errors. Therefore, the embodiments of the inventive concepts are not limited to the specific shape illustrated in the views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Embodiments of aspects of the present inventive concepts explained and illustrated herein include their complementary counterparts. The same reference numerals or the same reference designators denote the same elements throughout the specification.

Moreover, embodiments are described herein with reference to cross-sectional illustrations and/or plane illustrations that are idealized illustrations. Accordingly, variations from the shapes of the illustrations as a result, for example, of manufacturing techniques and/or tolerances, are to be expected. Thus, embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
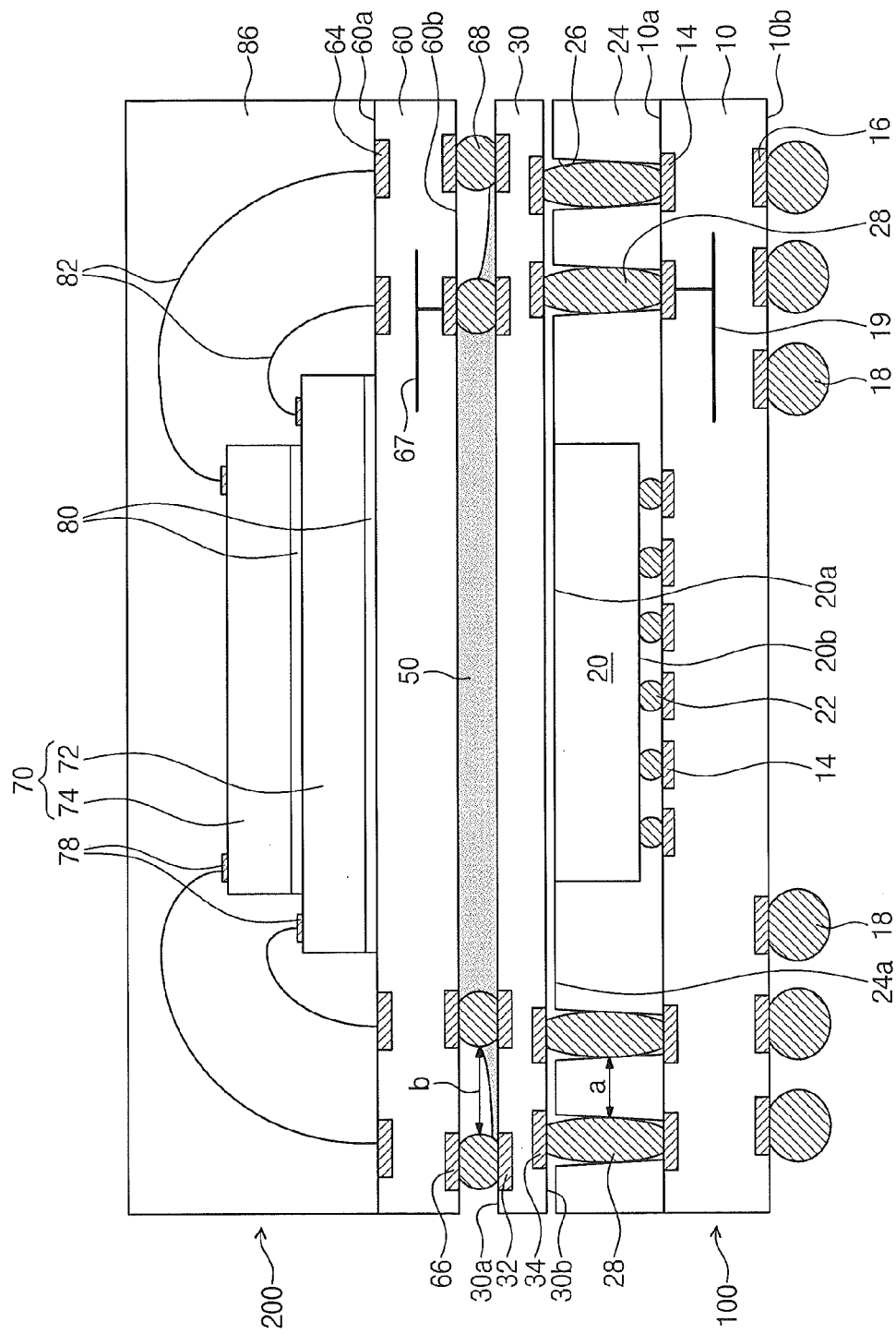
FIG. 1B is a cross-sectional view illustrating a semiconductor package device comparative to the semiconductor package device of the FIG. 1A.
Figure 2:
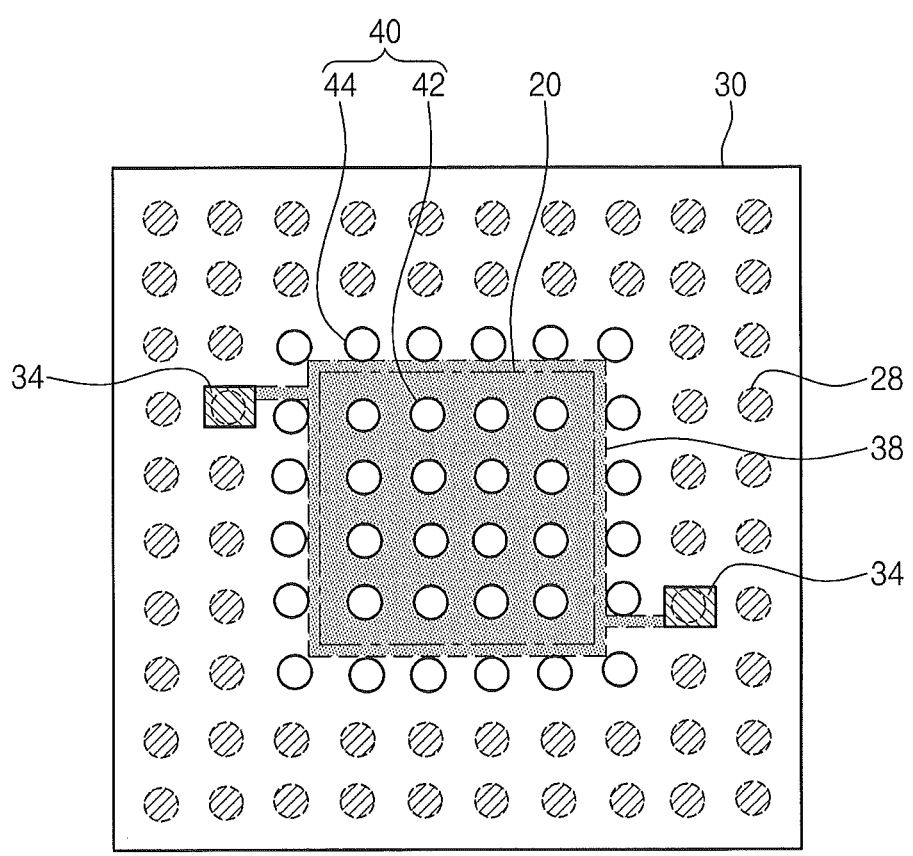
FIG. 2 is a plan view illustrating first via-connecting terminals and an interposer including a ground layer of a semiconductor package device according to some embodiments of the inventive concepts.

FIG. 1A is a cross-sectional view illustrating a semiconductor package device 300 according to some embodiments of the inventive concepts, and FIG. 1B is a cross-sectional view illustrating a semiconductor package device comparative to the semiconductor package device of the FIG. 1A. FIG. 2 is a plan view illustrating an interposer 30 including a ground layer 38 of the semiconductor package device 300 illustrated in FIG. 1A.

Referring to FIG. 1A, a semiconductor package device 300 according to some embodiments of inventive concepts may be a package-on-package (PoP) device. The semiconductor package device 300 may include a lower package 100, an interposer 30, an upper package 200, and a heat transfer member 50 between the interposer 30 and the upper package 200.

The lower package 100 and the interposer 30 may be connected to each other through first via-connecting terminals 28. The lower package 100 and the interposer 30 may be electrically and physically connected to each other.

The lower package 100 includes a first package substrate 10. The first package substrate 10 may be, for example, a printed circuit board (PCB). The first package substrate 10 may include a first surface 10a and a second surface 10b opposite to each other. For example, the first surface 10a and the second surface 10b of the first package substrate 10 may be a top surface and a bottom surface of the first package substrate 10, respectively. First connecting pads 14 may be disposed on the first surface 10a of the first package substrate 10, and second connecting pads 16 may be disposed on the second surface 10b of the first package substrate 10. The first connecting pads 14 may be electrically connected to the second connecting pads 16 through interconnections disposed within the first package substrate 10. The first package substrate 10 may include a ground layer 19 of the interconnections. The ground layer 19 may include a metal conductive layer. For example, the ground layer 19 may include copper (Cu) and/or a copper alloy. The ground layer 19 may extend to an outer periphery of the first package substrate 10. The ground layer 19 may have a plane-shape.

The first connecting pads 14 may be electrically connected to first chip connecting terminals 22 and the first via-connecting terminals 28. The second connecting pads 16 may be connected to external connecting terminals 18. The external connecting terminals 18 may be electrically connected to a semiconductor module board or a system board. The external connecting terminals 18 may be, for example, solder balls arranged in an array form. The external connecting terminals 18 may include copper, nickel, gold, indium, bismuth, tin, and/or other non-reactive metals.

A lower semiconductor chip, i.e., a first semiconductor chip 20 may be mounted on the first package substrate 10 by a flip-chip bonding technique, so that a second surface 20b of the first semiconductor chip 20 may face the first package substrate 10. The second surface 20b of the first semiconductor chip 20 may be an active surface on which integrated circuits are disposed. The first semiconductor chip 20 may be electrically connected to the interconnections disposed inside the first package substrate 10 through the first chip connecting terminals 22 and the first connecting pads 14. The first chip connecting terminal 22 may be, for example, a solder bump. For example, the first semiconductor chip 20 may be a logic device such as a microprocessor, an application processor, and/or a controller. However, the inventive concepts are not limited thereto.

A first molding compound layer 24 is on the first surface 10a of the first package substrate 10. The first molding compound layer 24 may seal at least a portion of a sidewall of the first semiconductor chip 20. The first molding compound layer 24 may fill a space between the second surface 20b of the first semiconductor chip 20 and the first surface 10a of the first package substrate 10. A top surface 24a of the first molding compound layer 24 may be substantially coplanar with a first surface 20a (i.e., a top surface) of the first semiconductor chip 20. Thus, the first surface 20a of the first semiconductor chip 20 may not be covered with the first molding compound layer 24 but may be exposed.

The first molding compound layer 24 may include molding via-holes 26. The molding via-holes 26 may be spaced apart from the first semiconductor chip 20. In some embodiments, portions of the first molding compound layer 24 may be removed using a laser drilled process (LDP) to form the molding via-holes 26. Alternatively, the portions of the first molding compound layer 24 may be removed using a general etching process instead of the laser drilled process (LDP) to form the molding via-holes 26.

The molding via-hole 26 may have an inclined sidewall profile. The molding via-holes 26 may expose the first via-connecting terminals 28.

The interposer 30 may be on the lower package 100. The interposer 30 may be, for example, a printed circuit board (PCB). The interposer 30 may be a medium electrically connecting the lower package 100 to the upper package 200. For example, if a distance between connecting terminals disposed on the first surface 10a of the first package substrate 10 is different from a distance between connecting terminals disposed on a second surface 60b of a second package substrate 60, it may be difficult to electrically connect the lower package 100 to the upper package 200. In this case, the interposer 30 may be used. The interposer 30 can connect connecting terminals having a first distance therebetween to connecting terminals having a second distance different from the first distance therebetween. The connecting terminals having the first distance may be electrically connected to the connecting terminals having the second distance through interconnections disposed within the interposer 30.

The interposer 30 may include a first surface 30a and a second surface 30b opposite to each other. For example, the first surface 30a of the interposer 30 may be a top surface of the interposer 30, and the second surface 30b of the interposer 30 may be a bottom surface of the interposer 30. Third connecting pads 32 may be disposed on the first surface 30a of the interposer 30, and fourth connecting pads 34 may be disposed on the second surface 30b of the interposer 30. The third connecting pads 32 may be electrically connected to the fourth connecting pads 34 through the interconnection disposed within the interposer 30. A distance between the third connecting pads 32 may be different from a distance between the fourth connecting pads 34. For example, the distance between the third connecting pads 32 may be greater than the distance between the fourth connecting pads 34.

The interposer 30 may include at least one opening 40 penetrating the interposer 30. The opening 40 may include at least one first opening 42 and at least one second opening 44. The first opening 42 may be formed in a region of the interposer 30, which is provided directly on the first semiconductor chip 20. In other words, the first opening 42 may be formed in a region of the interposer 30, which overlaps with the first semiconductor chip 20. The second opening 44 may be formed in a region of the interposer 30, which is provided directly on the first molding compound layer 24 around the first semiconductor chip 20. For example, the second opening 44 may be formed in a region of the interposer 30, which is spaced apart from the first semiconductor chip 20 by a distance g in a direction parallel to the first surface 20a of the first semiconductor chip 20 and overlaps with the first molding compound layer 24. The at least one second opening 44 may surround the at least one first opening 42. The first opening 42 may have a first width c, and the second opening 44 may have a second width d. The first width c of the first opening 42 may be different from the second width d of the second opening 44. For example, the first width c of the first opening 42 may be greater than the second width d of the second opening 44. The first and second openings 42 and 44 may be through-holes or through-slits.

The opening 40 of the interposer 30 may reduce or prevent the heat transfer member 50 described later from being connected to second via-connecting terminals 68. For example, as illustrated in FIG. 1B, if the heat transfer member 50 having fluidity (i.e., a flowable heat transfer member) is on the interposer 30, the heat transfer member 50 may flow outside the region overlapping with the first semiconductor chip 20, so as to be connected to some of the second via-connecting terminals 68 or some of the third connecting pads 32. Thus, an electrical short may occur between the second via-connecting terminals 68, or connection failure may be caused between the second via-connecting terminals 68 and the third connecting pads 32. However, the at least one opening 40 may be provided in the interposer 30 in the embodiments described above.

Thus, as illustrated in FIG. 1A, the heat transfer member 50 may flow into the opening 40 such that a flow of the heat transfer member 50 toward the second via-connecting terminals 68 may be interrupted. As a result, it is possible to reduce or prevent the electrical short between the second via-connecting terminals 68 or the connection failure between the second via-connecting terminals 68 and the third connecting pads 32. Thus, electrical signals of the semiconductor package device 300 may be easily transmitted between the lower package 100 and the upper package 200 without interference of the heat transfer member 50.

Referring to FIGS. 1A and 2, a ground layer 38 may be disposed within the interposer 30. The ground layer 38 may include a metal conductive layer. The ground layer 38 may include a metal such as copper or a copper alloy. The ground layer 38 may have a mesh-shape or plane-shape having a size greater than that of the first semiconductor chip 20. At least one first opening 42 may penetrate the ground layer 38. The ground layer 38 may be connected to, for example, at least one of the fourth connecting pads 34. Additionally, the ground layer 38 may be connected to at least one of the third connecting pads 32 through a connecting line 31 of the interposer 30. Thus, the ground layer 38 may be connected to both the at least one of the third connecting pads 32 and the at least one of the fourth connecting pads 34. The ground layer 38 may be connected to at least one of the first via-connecting terminals 28 through the at least one of the fourth connecting pads 34. In order to emphasize the fourth connecting pads 34 connected to the ground layer 38, the fourth connecting pads 34 connected to others of the first via-connecting terminals 28 are omitted in FIG. 2. The ground layer 38 may be electrically connected to the ground layer 19 of the first package substrate 10 through the at least one of the first via-connecting terminals 28. Since the ground layer 38 of the interposer 30 enlarges a ground area along with the ground layer 19 of the first package substrate 10, impedance of the semiconductor package device 300 can be reduced. Thus, a power voltage can be stably provided to semiconductor chips 20, 72 and 74 of semiconductor package device 300.

The upper package 200 may be disposed on the interposer 30. The interposer 30 and the upper package 200 may be connected to each other through the second via-connecting terminals 68. The upper package 200 may include the second package substrate 60. The second package substrate 60 may be, for example, a printed circuit board (PCB). The second package substrate 60 may include a first surface 60a and a second surface 60b opposite to each other. In other words, the first surface 60a and the second surface 60b of the second package substrate 60 may be a top surface and a bottom surface of the second package substrate 60, respectively. Fifth connecting pads 64 may be disposed on the first surface 60a of the second package substrate 60, and sixth connecting pads 66 may be disposed on the second surface 60b of the second package substrate 60. The fifth connecting pads 64 may be electrically connected to corresponding bonding wires 82, respectively. The sixth connecting pads 66 may be connected to the second via-connecting terminals 68.

At least one upper semiconductor chip 70 may be on the second package substrate 60. For example, a second semiconductor chip 72 and a third semiconductor chip 74 may be stacked to be mounted on the second package substrate 60. The second semiconductor chip 72 or the third semiconductor chip 74 may include, for example, a memory chip such as a dynamic random access memory (DRAM) chip, a flash memory chip, a magnetic random access memory (MRAM) chip, a phase change random access memory (PRAM) chip, a resistance random access memory (ReRAM) chip, and/or a static random access memory (SRAM) chip. The second semiconductor chip 72 may be bonded to the second package substrate 60 by an adhesive 80, and the third semiconductor chip 74 may be bonded to the second semiconductor chip 72 by an adhesive 80. Each of the first and second semiconductor chips 72 and 74 may be electrically connected to the fifth connecting pads 64 disposed on the second package substrate 60 through the bonding wires 82 connected to chip pads 78 disposed on a top surface of each of the first and second semiconductor chips 72 and 74. A second molding compound layer 86 may be provided on the top surface 60a of the second package substrate 60 to seal the first and second semiconductor chips 72 and 74. The fifth connecting pads 64 and the sixth connecting pads 66 of the second package substrate 60 may be electrically connected to each other through interconnections disposed within the second package substrate 60. The second package substrate 60 may include a ground layer 67. The ground layer 67 may include a metal conductive layer. For example, the ground layer 67 may include copper and/or a copper alloy. The ground layer 67 may extend to an outer periphery of the second package substrate 60. The ground layer 67 may have a plane-shape.

The first via-connecting terminals 28 may electrically connect the lower package 100 to the interposer 30 of the semiconductor package device 300. The first via-connecting terminals 28 may be connected to the first connecting pads 14 of the first package substrate 10 disposed around the first semiconductor chip 20 and the fourth connecting pads 34 of the interposer 30, so as to connect the lower package 100 to the interposer 30. The first via-connecting terminals 28 may be, for example, solder bumps. The first via-connecting terminals 28 may include copper, nickel, gold, indium, bismuth, tin, and/or other non-reactive metals.

The first via-connecting terminals 28 may be disposed in the first molding compound layer 24 around the first semiconductor chip 20. At least one of the first via-connecting terminals 28 may extend from the top surface 24a of the first molding compound layer 24 to the second surface 30b of the interposer 30 so as to be connected to the fourth connecting pad 34. The first via-connecting terminals 28 may be spaced apart from each other with a distance a therebetween. The first via-connecting terminals 28 may be disposed around the first semiconductor chip 20. The distance of the first via-connecting terminals 28 may be equal or similar to a distance between the molding via-holes 26.

The second via-connecting terminals 68 may electrically connect the interposer 30 to the upper package 200 of the semiconductor package device 300. The second via-connecting terminals 68 may be connected to the third connecting pads 32 of the interposer 30 and the sixth connecting pads 66 of the second package substrate 60 so as to connect the interposer 30 to the upper package 200. The second via-connecting terminals 68 may be, for example, solder bumps. The second via-connecting terminals 68 may include copper, nickel, gold, indium, bismuth, tin, and/or other non-reactive metals. The second via-connecting terminals 68 may be spaced apart from each other with a distance b therebetween. The ground layer 38 of the interposer 30 may be electrically connected to the ground layer 67 of the second package substrate 60 of the upper package 200 through the second via-connecting terminal 68.

Signals (e.g., data input/output signals and a power signal) generated from an external system and/or the semiconductor chips 20, 72 and 74 may be transmitted through the first via-connecting terminals 28 and the second via-connecting terminals 68.

The heat transfer member 50 may include a first portion 50a disposed between the second surface 60b of the second package substrate 60 and the top surface 30a of the interposer 30, a second portion 50b disposed in the at least one opening 40 of the interposer 30, and a third portion 50c disposed between the interposer 30 and the lower package 100 (e.g., between the second surface 30b of the interposer 30 and the first surface 20a of the first semiconductor chip 20). The first surface 20a of the first semiconductor chip 20 may be a non-active surface on which integrated circuits are not disposed. The heat transfer member 50 may be a conductive or non-conductive thermal interface material (TIM). The TIM may be a material formed by mixing a resin material with a thermal conductive filler. For example, the resin material may be an addition curable silicone composition. For example, the thermal conductive filler may be particles or powder of a conductive material (e.g., silver (Ag) and/or aluminum (Al)), and/or particles or powder of a non-conductive material (e.g., aluminum oxide ($Al_2O_3$) and/or silicon dioxide ($SiO_2$)). The heat transfer member 50 may have an adhesive function.

The heat transfer member 50 may be formed by coating a liquid heat transfer material on the interposer 30 (e.g., the region of the interposer 30 overlapping with the first semiconductor chip 20) and applying heat to solidify the liquid heat transfer material. At this time, since the heat transfer member 50 has the fluidity, the heat transfer member 50 may flow into the at least one opening 40 (e.g., the at least one first opening 42) of the interposer 30 to fill a gap between the lower package 100 and the interposer 30 and to contact the first surface 20a of the first semiconductor chip 20. The heat transfer member 50 may further expand to be disposed in the second opening 44.

The heat transfer member 50 may be connected to the ground layer 38 of the interposer 30. For example, the second portion 50b of the heat transfer member 50, which is disposed in the at least one opening 40 of the interposer 30, may be connected to the ground layer 38. Additionally, the third portion 50c of the heat transfer member 50 may also be connected to the ground layer 38. In other embodiments, if the ground layer 38 is provided on the first surface 30a of the interposer 30, the first portion 50a of the heat transfer member 50 may also be connected to the ground layer 38. Thus, if the heat transfer member 50 is a material having conductivity, a ground layer of the semiconductor package device 300 may further expand to increase the stability of the supply of the power voltage. The ground layer of the semiconductor package device 300 may be expanded by an area of the heat transfer member 50 as well as the areas of the ground layers 38, 19 and 67 of the interposer 30 and the lower and upper packages 100 and 200. Thus, the impedance of the semiconductor package device 300 may be markedly reduced. As a result, the power voltage may be stably applied to the semiconductor chips 20, 72 and 74 of the semiconductor package device 300 such that electrical characteristics of the semiconductor package device 300 may be improved.

If the first semiconductor chip 20 of the lower package 100 is a logic device chip (e.g., a microprocessor, an application processor and/or a controller), an amount of heat may be generated from the first semiconductor chip 20 during operation of controlling a system. The heat may be released through the heat transfer member 50 outside the upper package 200. Since the third portion 50c of the heat transfer member 50 is in direct contact with the first surface 20a of the first semiconductor chip 20, the heat generated from the first semiconductor chip 20 may be transferred to the second package substrate 60 through the second portion 50b in the opening 42 and the first portion 50a of the heat transfer member 50. Thus, the heat may be released to the outside of the upper package 200. Additionally, the heat generated from the first semiconductor chip 20 may also be transferred to the first package substrate 10 through the ground layer 38 of the interposer 30 and the first via-connecting terminal 28, so as to be released to the outside of the lower package 100. Moreover, the heat generated from the first semiconductor chip 20 may also be transferred to the second package substrate 60 through the ground layer 38 and the second via-connecting terminal 68, so as to be released to the outside of the upper package 200. As a result, a heat release effect of the semiconductor package device 300 may be increased due to the heat transfer member 50 which is in contact with the ground layer 38 of the interposer 30.

FIGS. 3A to 3H are plan views illustrating modified examples of a design of the interposer 30, on which the heat transfer member 50 is disposed, in the semiconductor package device 300 illustrated in FIG. 1A.

Referring to FIGS. 1A and 3A to 3H, the interposer 30 may include an overlapping region 30-1 overlapping with the first semiconductor chip 20 of the lower package 100, and a non-overlapping region 30-2 not overlapping with the first semiconductor chip 20. The non-overlapping region 30-2 may correspond to an outer region disposed outside the overlapping region 30-1. The heat transfer member 50 may be disposed on the interposer 30. The at least one first opening 42 of the openings 40 of the interposer 30 may be disposed in the overlapping region 30-1, and the at least one second openings 44 of the openings 40 may be disposed in the non-overlapping region 30-2 to surround the at least one first opening 42.

Figure 3A:
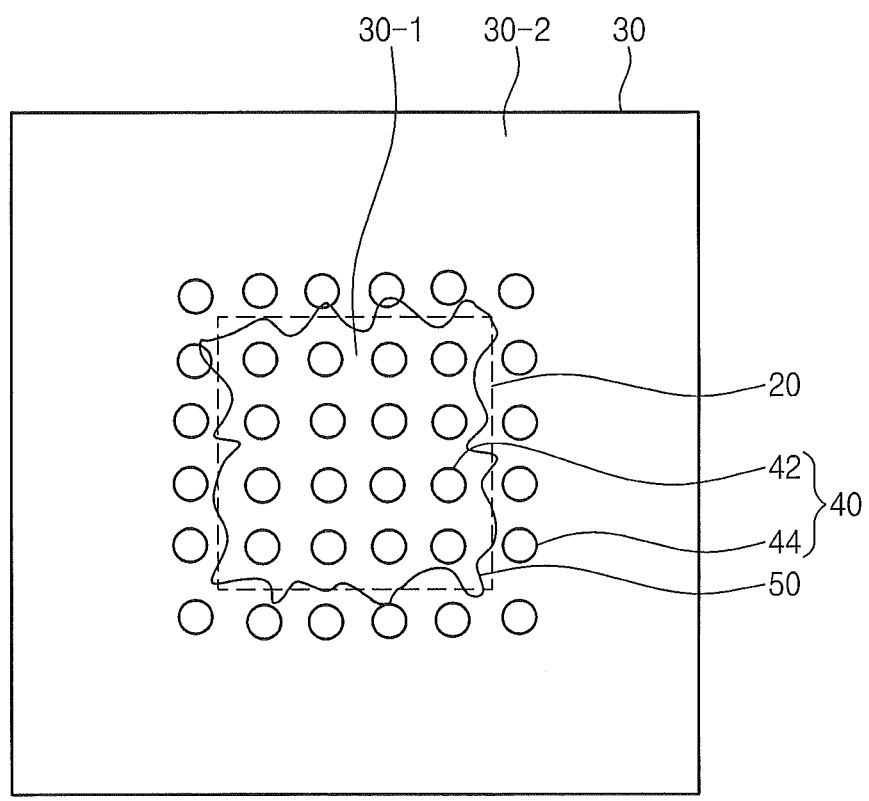
FIGS. 3A to 3H are plan views illustrating modified examples of a design of an interposer, on which a heat transfer member is disposed, in the semiconductor package device illustrated in FIG. 1A.
Figure 3B:
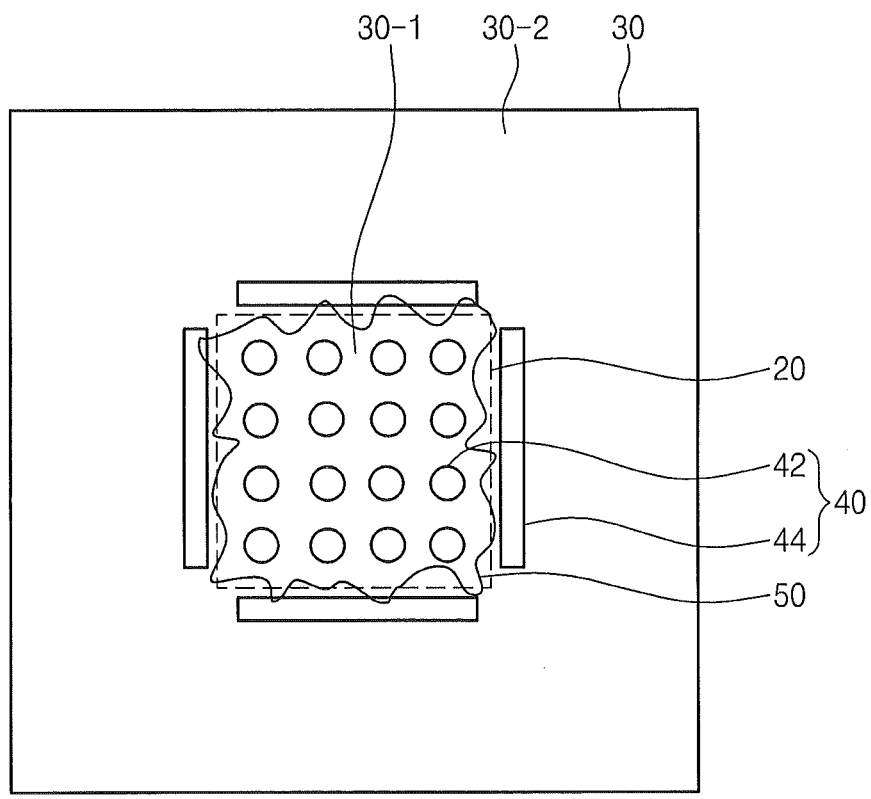
Figure 3C:
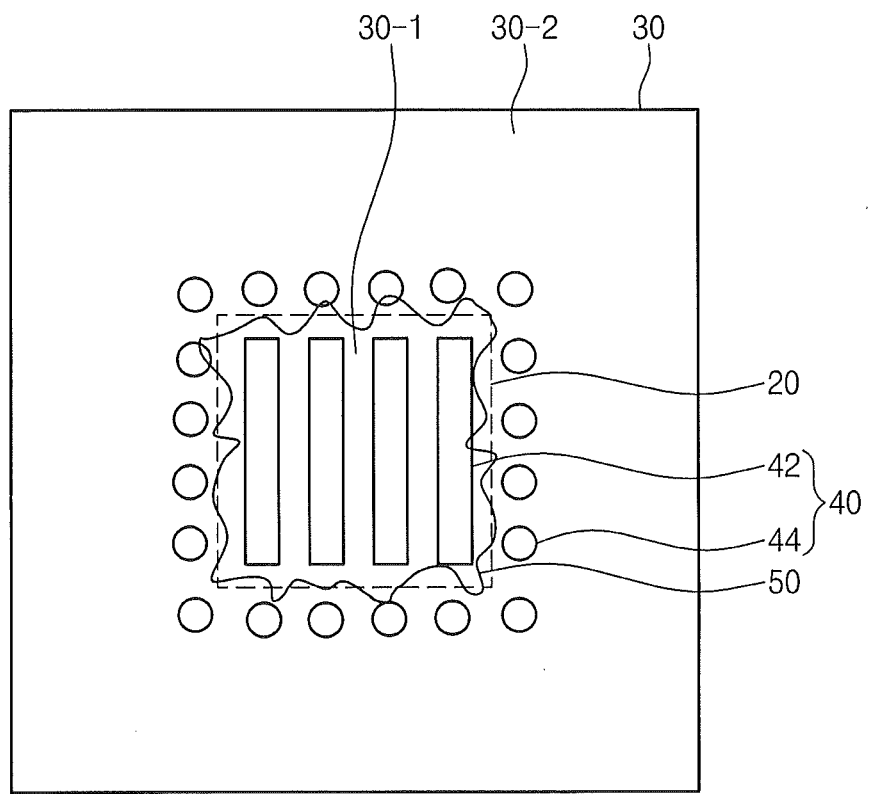
Figure 3D:
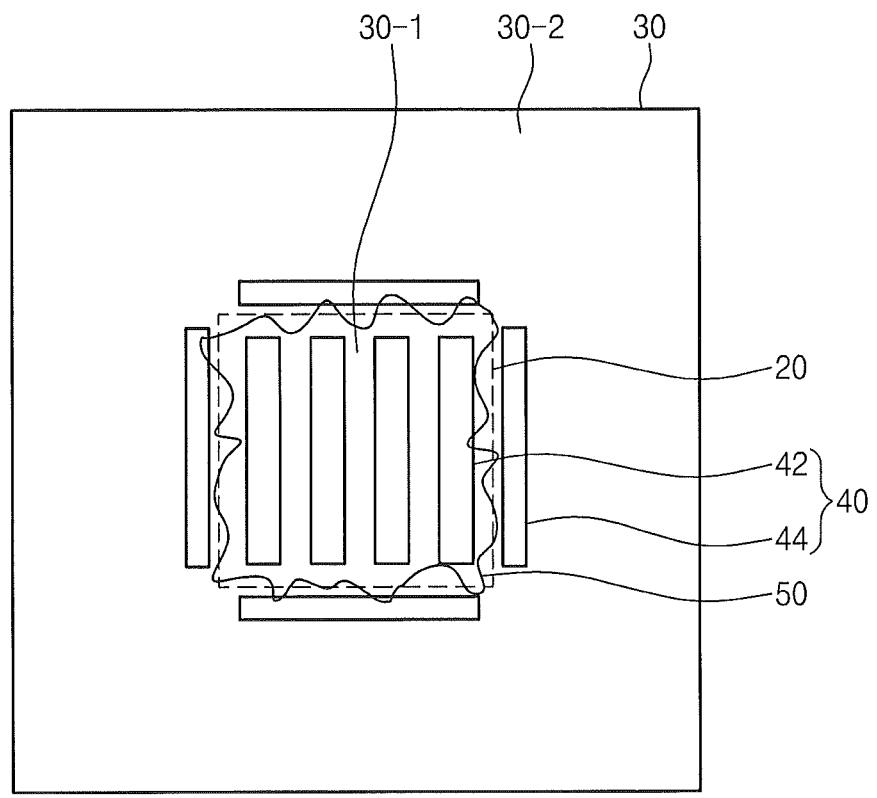
Figure 3E:
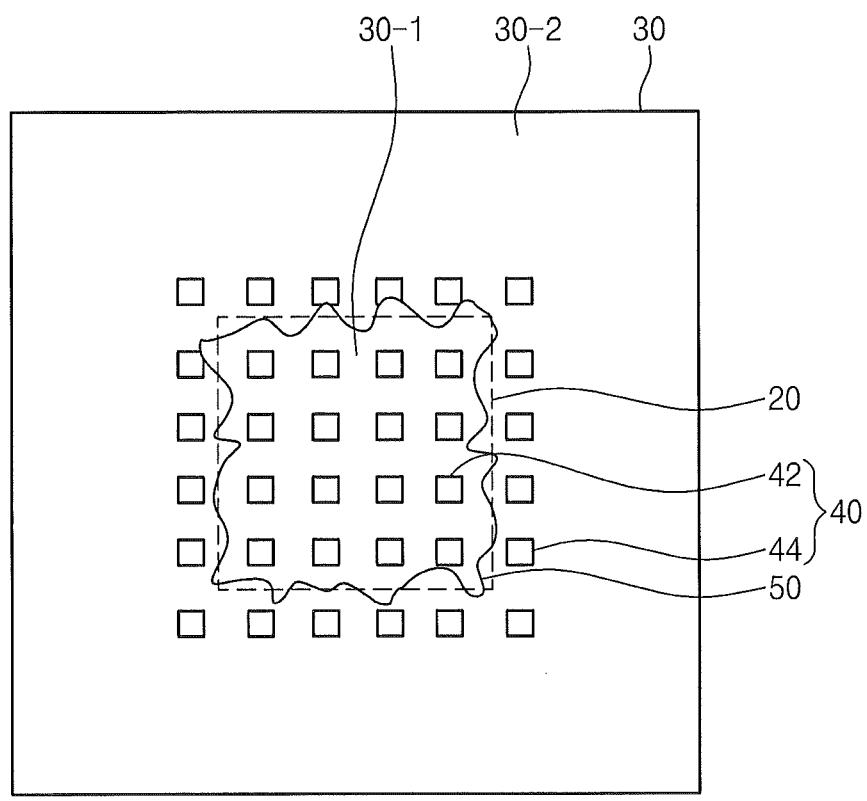

Referring to FIG. 3A, the first openings 42 and the second openings 44 may have hole-shapes. The hole-shapes may be circular shapes or elliptical shapes. Referring to FIG. 3B, the first openings 42 may have hole-shapes, and the second openings 44 may have slit-shapes. For example, the slit-shape may be a shape extending lengthwise in linear type or elliptical type. Referring to FIG. 3C, the first openings 42 may have slit-shapes, and the second openings 44 may have hole-shapes. Referring to FIG. 3D, all of the first and second openings 42 and 44 may have slit-shapes. Referring to FIG. 3E, the first openings 42 and the second openings 44 may have quadrilateral hole-shapes. However, the inventive concepts are not limited thereto. In other embodiments, the first openings 42 and the second openings 44 may have polygonal hole-shapes.

Figure 3F:
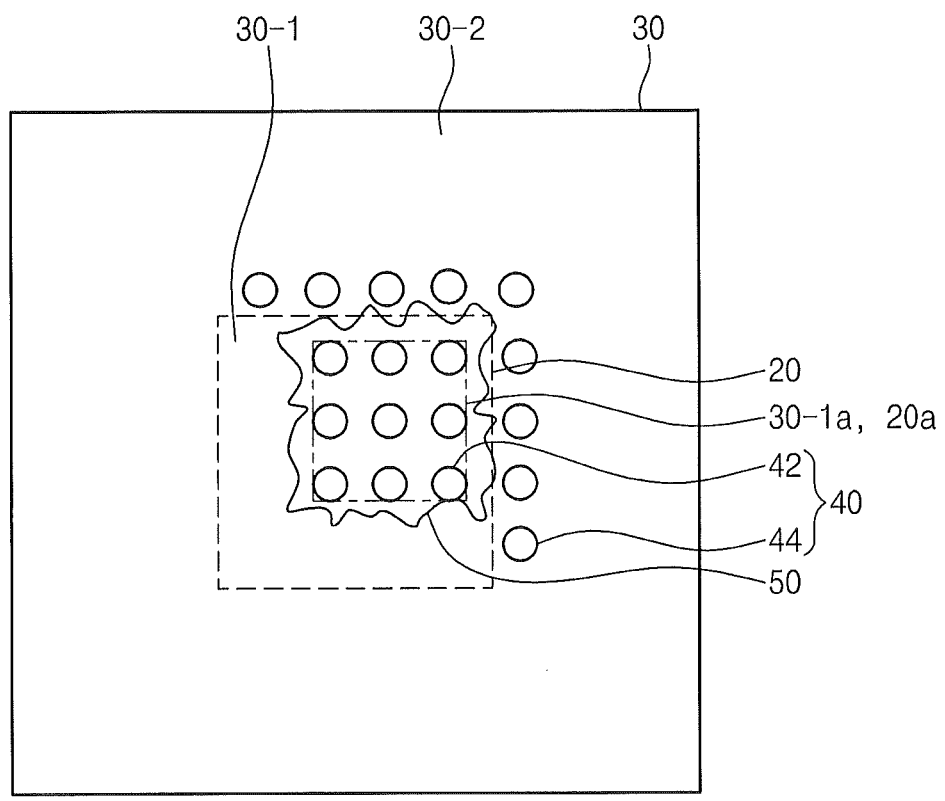

Referring to FIG. 3F, the first openings 42 may be disposed locally in the overlapping region 30-1 of the interposer 30. The second openings 44 may be disposed locally in the non-overlapping region 30-2 to surround the first openings 42. The region 30-1a in which the first openings 42 are formed locally may be a region of the interposer 30, which overlaps with a heat generating circuit part 20a, which generates a lot of heat during operation, of circuit parts of the first semiconductor chip 20. Thus, the heat generated from the heat generating circuit part 20a of the first semiconductor chip 20 may be intensively released outward through a small quantity of the heat transfer member 50 which is provided in the first opening 42 of the overlapping region 30-1 of the interposer 30 and is provided locally on the overlapping region 30-1 around the first opening 42. As a result, the heat release effect of the semiconductor package 300 may be improved.

Figure 3G:
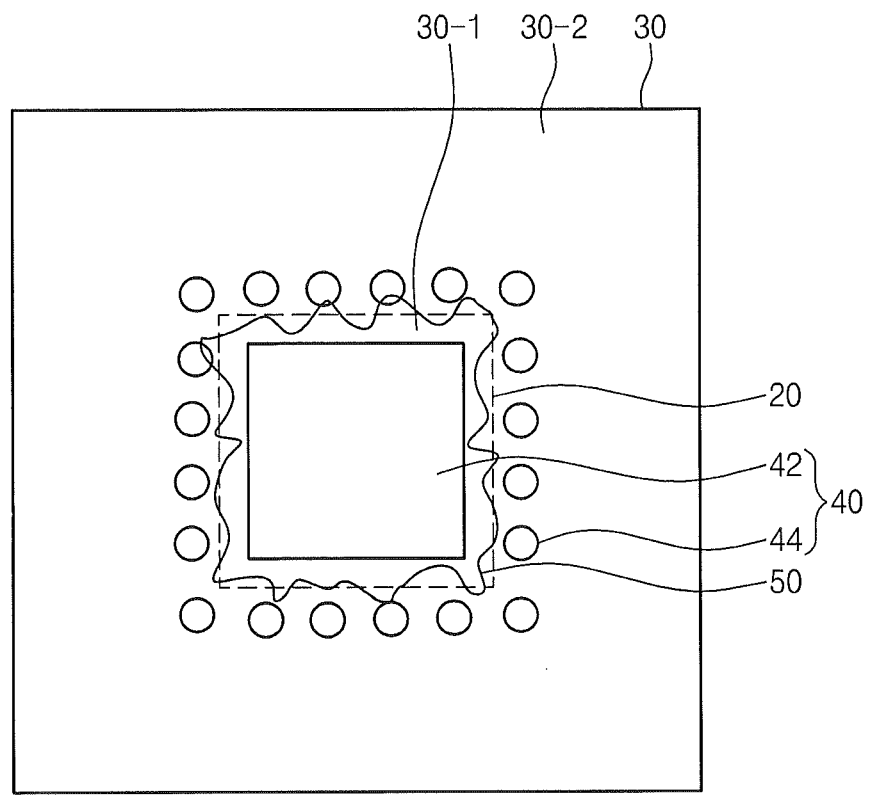
Figure 3H:
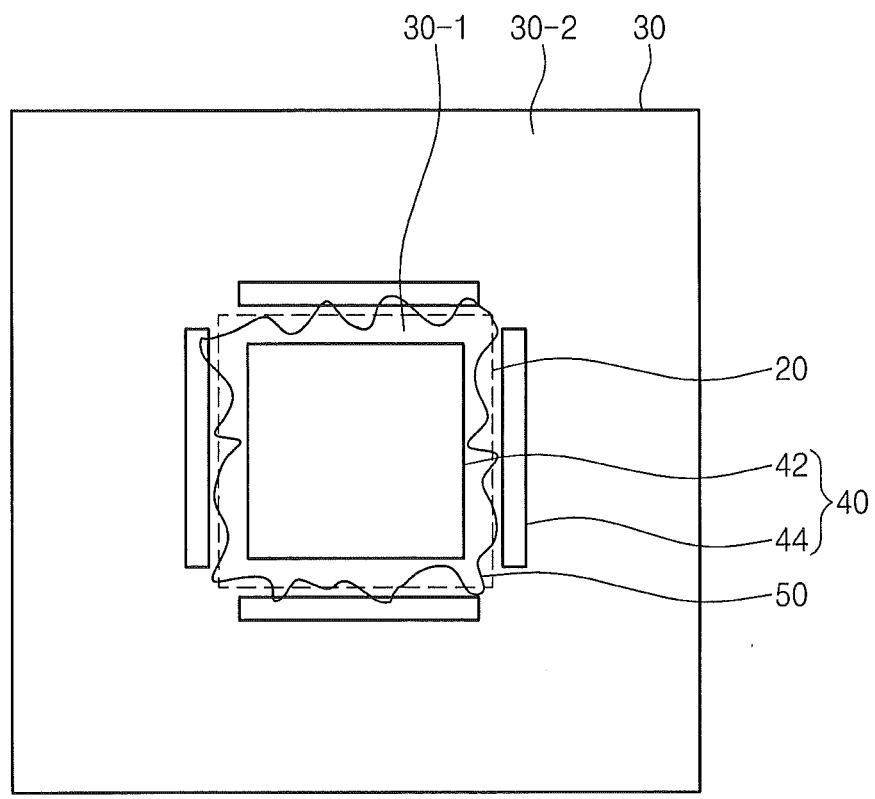

Referring to FIG. 3G, the first opening 42 may have one enlarged hole-shape, and the second opening 44 may include a plurality of second openings 44 having hole-shapes. Referring to FIG. 3H, the first opening 42 may have one enlarged hole-shape, and the second opening 44 may include a plurality of second openings 44 having slit-shapes. A size of the first opening 42 having the enlarged hole-shape may be increased to be similar or equal to a size of the overlapping region 30-1. Thus, a contact area of the heat transfer member 50 in the first opening 42 and the first semiconductor chip 20 may be increased by the first opening 42 having the enlarged area, so that the heat release effect may be more improved.

Additionally, a flow of the heat transfer member 50 toward the second via-connecting terminal 68 may be finally interrupted by the at least one first opening 42 and the second openings 44 surrounding the at least one first opening 42. The at least one opening 40 of the interposer 30 may reduce or prevent the electrical short between the second via-connecting terminals 68 or the connection failure between the third connecting pads 32 and the second via-connecting terminals 68, which is caused by the heat transfer member 50 flowing to the second via-connecting terminals 68 or the third connecting pads 32. Thus, the electrical signals may be easily transmitted between the lower package 100 and the upper package 200 without the interference of the heat transfer member 50. As a result, high reliable semiconductor package device 300 may be realized.

Figure 4A:
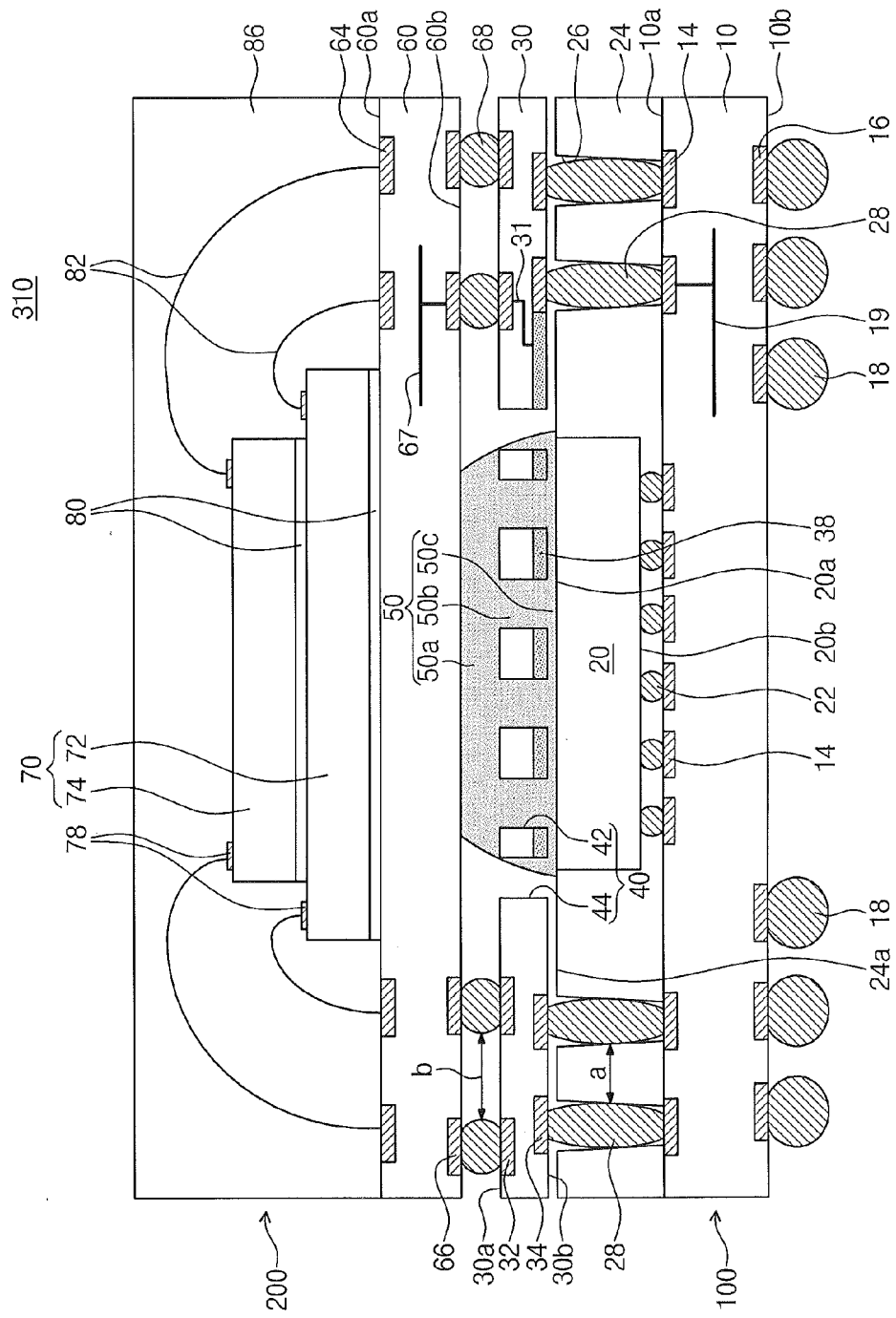
FIG. 4A is a cross-sectional view illustrating a semiconductor package device according to other embodiments of the inventive concepts.
Figure 4B:
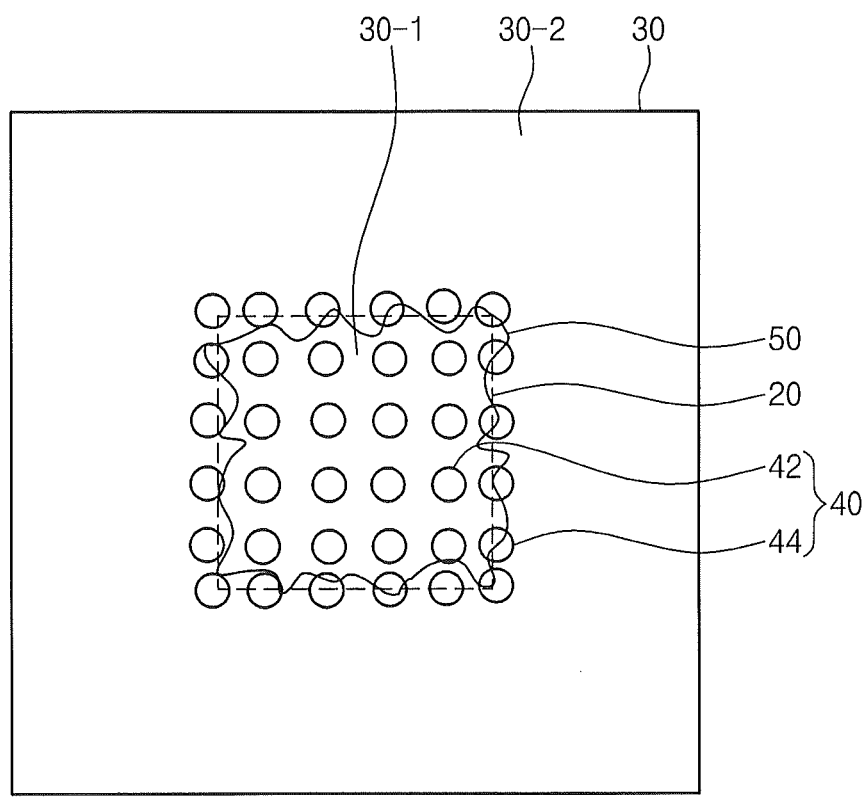
FIG. 4B is a plan view illustrating an interposer, on which a heat transfer member is disposed, in the semiconductor package device illustrated in FIG. 4A.

FIG. 4A is a cross-sectional view illustrating a semiconductor package device 310 according to other embodiments of the inventive concepts, and FIG. 4B is a plan view illustrating an interposer 30, on which a heat transfer member 50 is disposed, in the semiconductor package device 310 illustrated in FIG. 4A. In the present embodiment, the descriptions to the same elements as described in FIGS. 1A, 2 and 3A to 3H will be omitted for the purpose of ease and convenience in explanation. In other words, differences between the present embodiment and the aforementioned embodiment will be mainly described hereinafter.

Referring to FIGS. 4A and 4B, at least one first opening 42 of the interposer 30 may be disposed in the overlapping region 30-1 of the interposer 30, which overlaps with the first semiconductor chip 20 of the lower package 100. At least one second opening 44 of the interposer 30 may disposed over both of the overlapping region 30-1 and the non-overlapping region 30-2 at a boundary region between the overlapping region 30-1 and the non-overlapping region 30-2. Thus, the second opening 44 may expose both the top surface 24a of the first molding compound layer 24 and the first surface 20a of the first semiconductor chip 20 which are disposed under the second opening 44. Additionally, a distance between the second opening 44 and the first opening 42 may be less than a distance between the first openings 42. The heat transfer member 50 may extend into the second opening 44 and a space between the interposer 30 under the second opening 44 and the lower package 100, so that a contact area of the heat transfer member 50 and the first semiconductor chip 20 may be increased.

Figure 5:
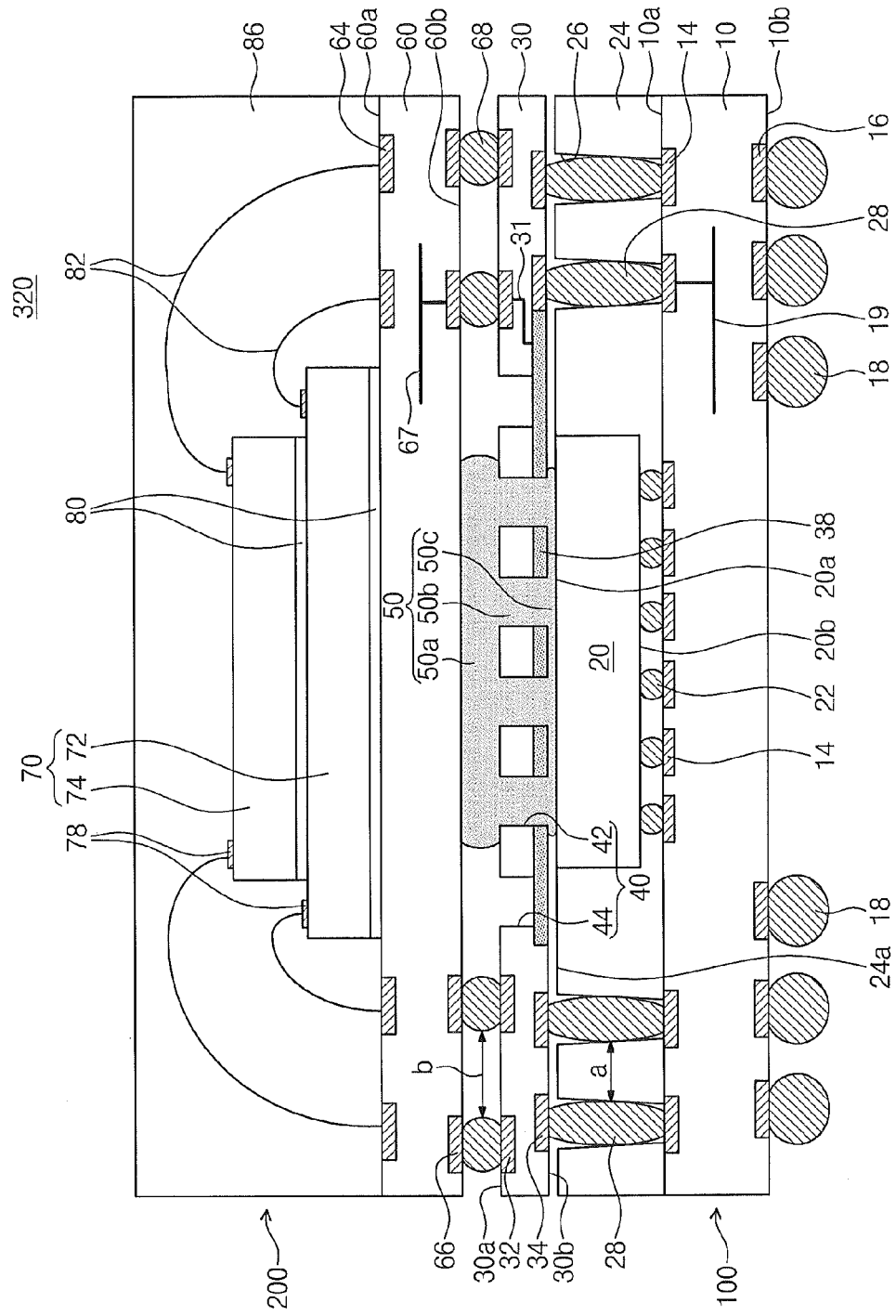
FIGS. 5 and 6 are cross-sectional views illustrating semiconductor package devices according to still other embodiments of the inventive concepts.

FIG. 5 is a cross-sectional view illustrating a semiconductor package device 320 according to still other embodiments of the inventive concepts. In the present embodiment, the descriptions to the same elements as described in FIG. 1A will be omitted for the purpose of ease and convenience in explanation. In other words, differences between the present embodiment and the aforementioned embodiments will be mainly described hereinafter.

Referring to FIG. 5, a second opening 44 of the interposer 30 may not penetrate the interposer 30. The second opening 44 may be a concave region where a portion of the interposer 30 is recessed. For example, the portion of the interposer 30 may be recessed until a top surface of the ground layer 38 of the interposer 30 is exposed, thereby forming the second opening 44. The second opening 44 may be a groove completely surrounding the at least one first opening 42. The openings 40 having the shapes illustrated in FIGS. 3A to 3H may be applied to the semiconductor package device 320 when viewed from a plan view.

Figure 6:
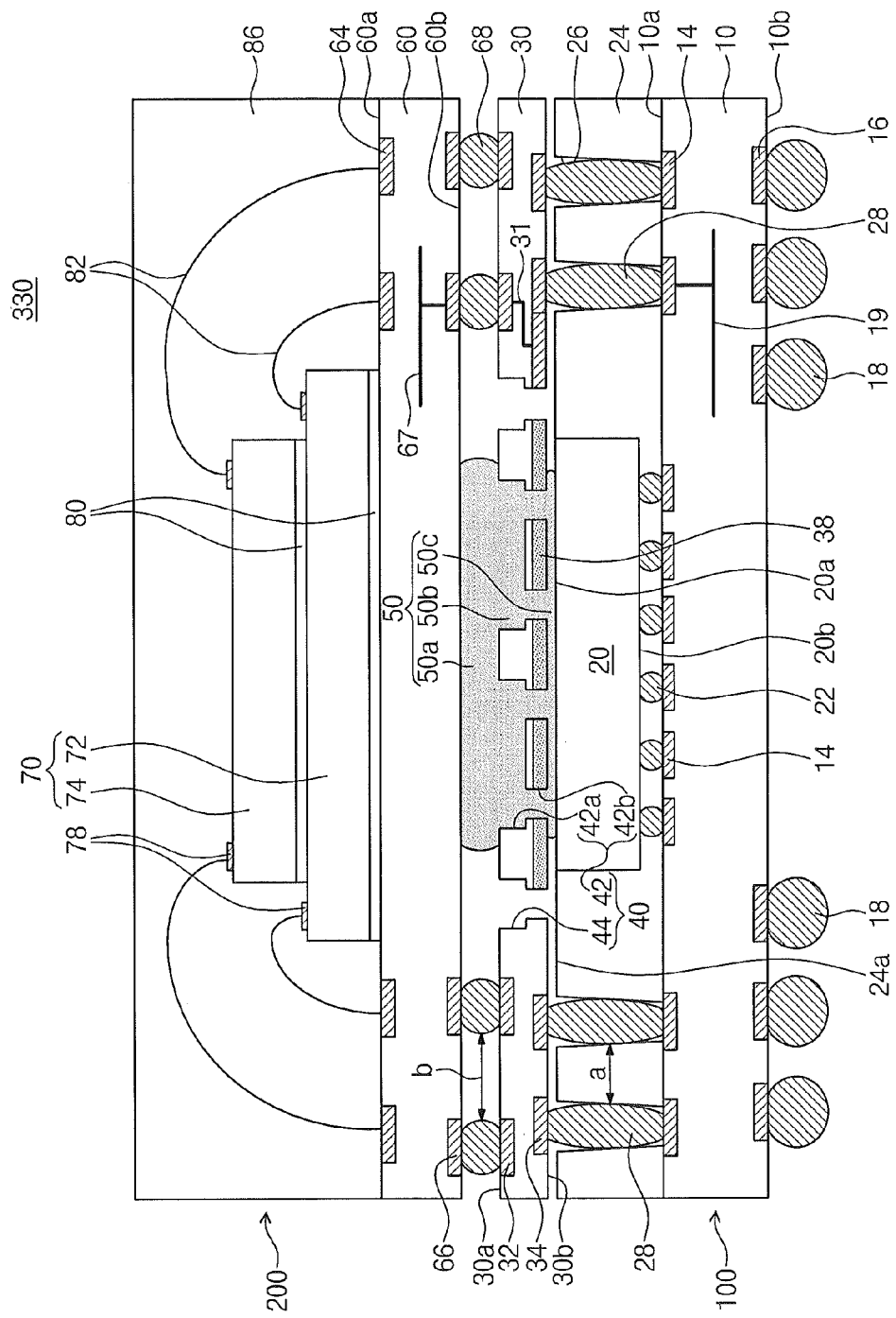

FIG. 6 is a cross-sectional view illustrating a semiconductor package device 330 according to yet other embodiments of the inventive concepts. In the present embodiment, the descriptions to the same elements as described in FIGS. 1A, and 2 to 5 will be omitted for the purpose of ease and convenience in explanation. In other words, differences between the present embodiment and the aforementioned embodiments will be mainly described hereinafter.

Referring to FIG. 6, an opening 40 of the interposer 30 may include a plurality of first openings 42 and at least one second opening 44 surrounding the first openings 42. The first opening 42 may include a first region 42a and a second region 42b disposed under the first region 42a. The first region 42a of the first opening 42 may be a concave region where a portion of the interposer 30 is recessed. The second region 42b of the first opening 42 may be a through-opening penetrating a lower portion of the interposer 30. For example, the first region 42a of the concave region may be formed in the region of the interposer 30, which overlaps with the first semiconductor chip 20. A plurality of the second regions 42b being the through-openings may be formed under the first region 42a. A width of the first region 42a may be greater than a width of the second region 42b. The second region 42b may be a through-hole or a through-slit. The second opening 44 of the interposer 30 may also be a through-opening including a lower region and an upper region having a width greater than that of the lower region.

Figure 7C:
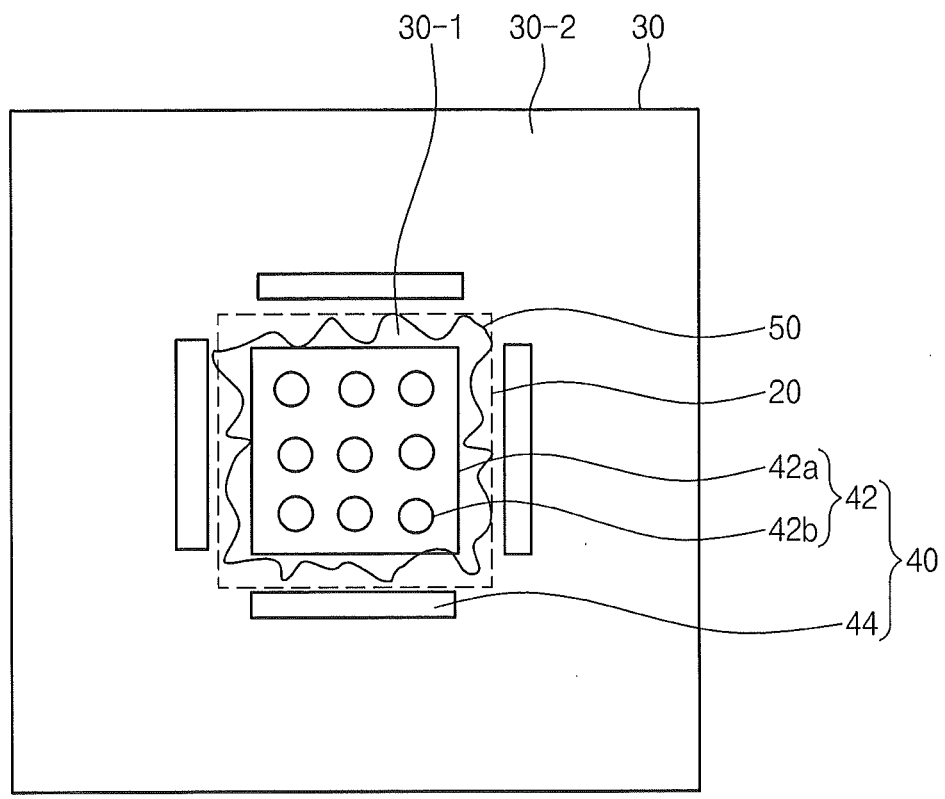

FIG. 7A is a cross-sectional view illustrating a semiconductor package device 340 according to yet still other embodiments of the inventive concepts, and FIGS. 7B and 7C are plan views illustrating modified examples of a design of an interposer 30, on which a heat transfer member 50 is disposed, in the semiconductor package device 340 illustrated in FIG. 7A. Hereinafter, the descriptions to the same elements as described in FIGS. 1A, and 2 to 6 will be omitted, and differences between the present embodiment and the aforementioned embodiments will be mainly described.

Referring to FIGS. 7A to 7C, a first opening 42 of the interposer 30 of the semiconductor package device 340 may include a first region 42a consisting of one concave region, and a second region 42b having a plurality of through-openings, as compared with the semiconductor package 330 illustrated in FIG. 6. The second region 42b may have, but not limited to, a through-hole-shape illustrated in FIGS. 7B and 7C. In other embodiments, the second region 42b may be a through-slit. A second opening 44 of the interposer 30 of the semiconductor package device 340 may be an opening having a lower region and an upper region which have the same width. For example, the second opening 44 may be a through-hole or through-slit penetrating the interposer 30. The first region 42a of the first opening 42 of the interposer 30 may be enlarged to have a size similar to that of the overlapping region 30-1, which overlaps with the first semiconductor chip 20, of the interposer 30. Thus, since the first region 42a of the first opening 42 has a concave shape of the wide size, the heat transfer member 50 may be stored in the overlapping region 30-1 overlapping with the first semiconductor chip 20. As a result, it is possible to reduce or prevent the heat transfer member 50 from flowing outside the overlapping region 30-1.

Figure 8:
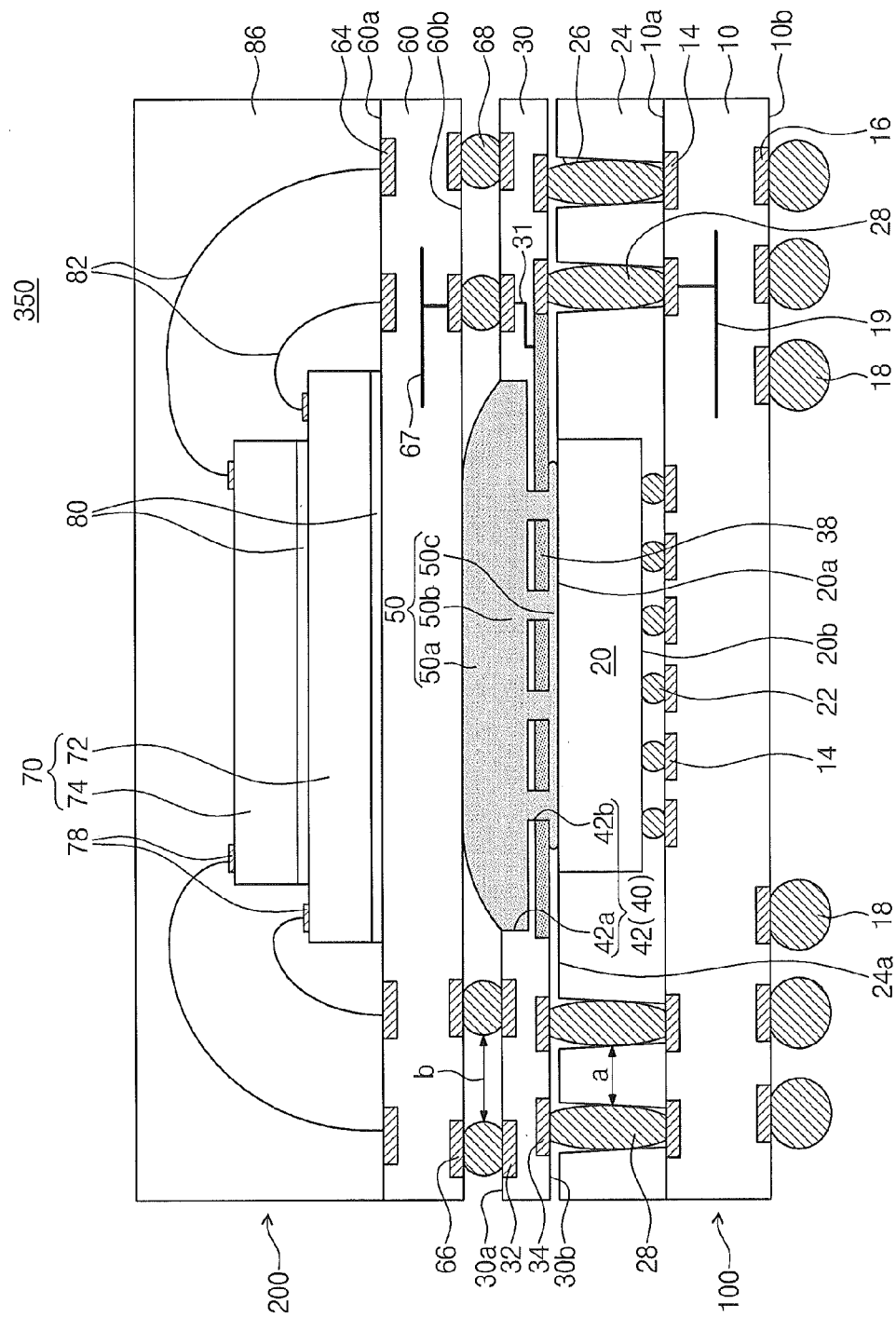
FIGS. 8 to 10 are cross-sectional views illustrating semiconductor package devices according to yet still embodiments of the inventive concepts.

FIG. 8 is a cross-sectional view illustrating a semiconductor package device 350 according to yet still embodiments of the inventive concepts. Hereinafter, the descriptions to the same elements as described in FIGS. 1A, and 2 to 7C will be omitted, and differences between the present embodiment and the aforementioned embodiments will be mainly described.

Referring to FIG. 8, an interposer 30 of the semiconductor package device 350 may include a first opening 42 including a first region 42a that has one concave region further enlarged outside a region overlapping with the first semiconductor chip 20 (e.g., the overlapping region 30-1 illustrated in FIGS. 7B and 7C). For example, a second opening may not be formed, but the first region 42a may be enlarged more than an overlapping area of the first semiconductor chip 20 and the interposer 30. The first opening 42 may further include a plurality of second regions 42b of through-openings under the first region 42a.

As described above, since the first region 42a of the first opening 42 of the interposer 30 has at least one concave region having the wide area in the semiconductor package devices 330, 340 and 350 illustrated in FIGS. 6 to 8, the heat transfer member 50 may be stored in the first region 42a and may be reduced or prevented from flowing outside the first region 42a.

Figure 9:
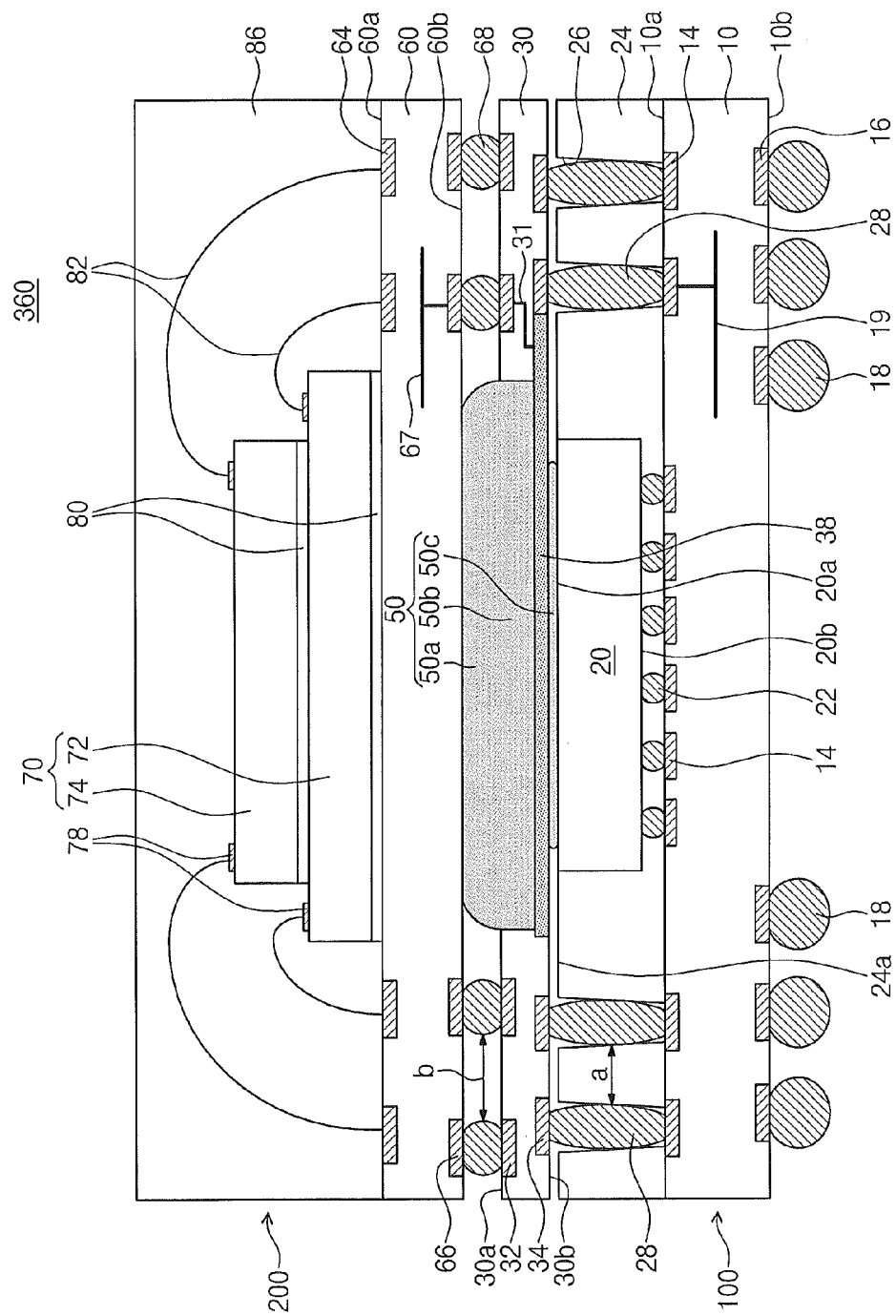

FIG. 9 is a cross-sectional view illustrating a semiconductor package device 360 according to yet still embodiments of the inventive concepts. Hereinafter, the descriptions to the same elements as described in FIG. 1A will be omitted, and differences between the present embodiment and the aforementioned embodiments will be mainly described.

Referring to FIG. 9, an interposer 30 of the semiconductor package 360 may include a first opening 42 having one concave region further enlarged outside a region overlapping with the first semiconductor chip 20. For example, the first opening 42 may be a concave region where a portion of the interposer 30 is recessed. The first opening 42 may expose the ground layer 38 of the interposer 30. A third portion 50c of the heat transfer member 50 may be separated from first and second portions 50a and 50b of the heat transfer member 50. The third portion 50c of the heat transfer member 50 may be provided on the first semiconductor chip 20 when the lower package 100 is combined with the interposer 30. Thus, the third portion 50c of the heat transfer member 50 may be formed to be connected to the ground layer 38 of the interposer 30. The first portion 50a and the second portion 50b of the heat transfer member 50 may be provided on the interposer 30 and in the first opening 42 when the interposer 30 is combined with the upper package 200. Thus, heat generated during operation of the first semiconductor chip 20 may be transferred to the second portion 50b and the first portion 50a of the heat transfer member 50 through the third portion 50c of the heat transfer member 50 and the ground layer 38 contacting the third portion 50c of the interposer 30, and the heat may be released outward through the upper package 200 contacting the heat transfer member 50. Additionally, the heat generated from the first semiconductor chip 20 may be transferred to the first package substrate 10 through the first via-connecting terminal 28 connected to the ground layer 38 of the interposer 30, and the heat may be then released to the outside of the lower package 100.

Figure 10:
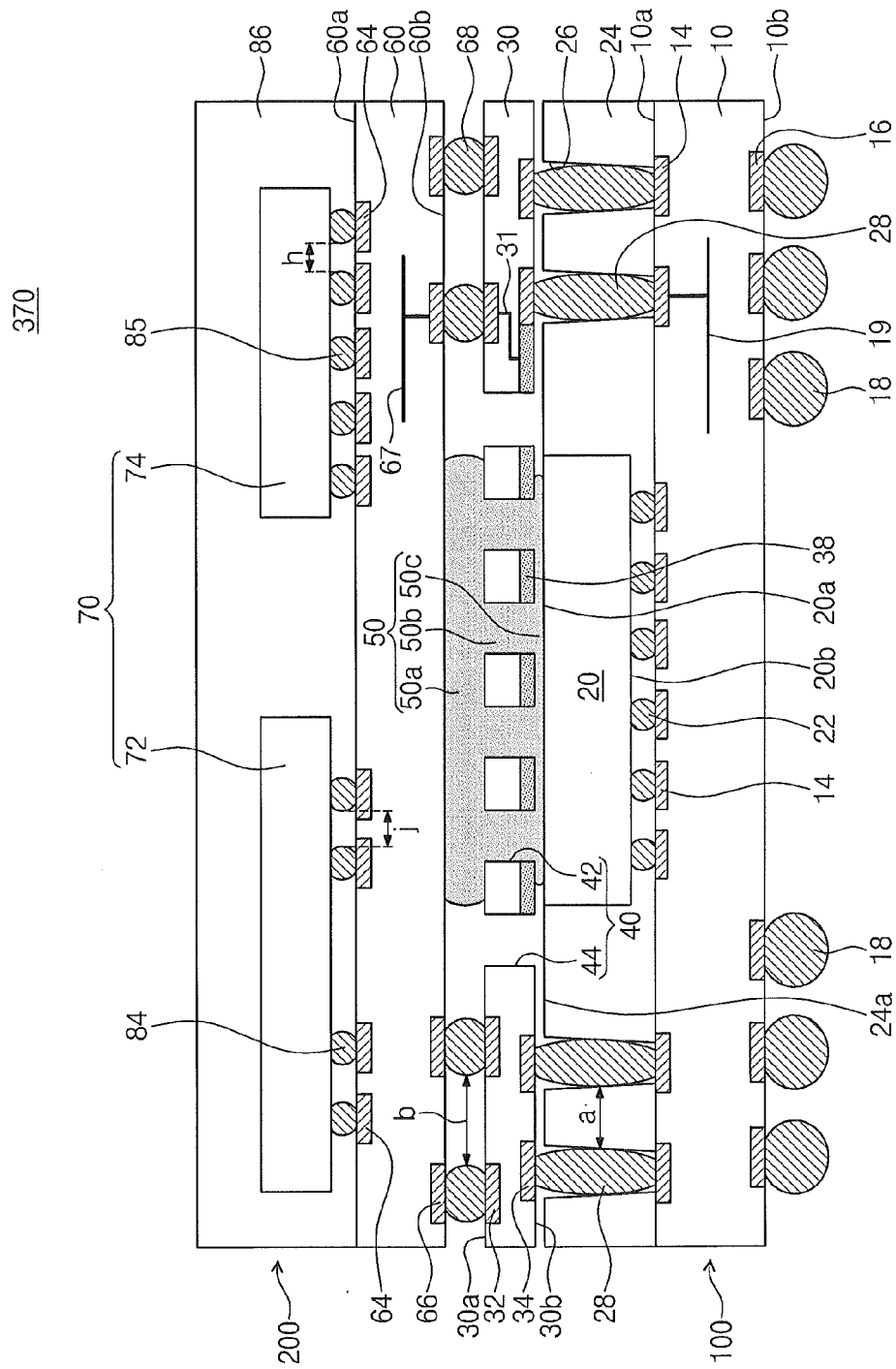

FIG. 10 is a cross-sectional view illustrating a semiconductor package device 370 according to yet still embodiments of the inventive concepts. Hereinafter, the descriptions to the same elements as described in FIG. 1A will be omitted, and differences between the present embodiment and the aforementioned embodiments will be mainly described.

Referring to FIG. 10, an upper package 200 of the semiconductor package device 370 may have upper semiconductor chips 70 including a plurality of semiconductor chips spaced apart from each other and mounted on the second package substrate 60. For example, the upper semiconductor chips 70 may include a second semiconductor chip 72 and a third semiconductor chip 74 that are disposed in parallel to each other. The second semiconductor chip 72 and the third semiconductor chip 74 may be mounted on the second package substrate 60 of the upper package 200 by a flip chip bonding technique. On the other hand, the second semiconductor chip 72 may include at least two stacked semiconductor chips. For example, the second semiconductor chip 72 may be a memory chip such as a DRAM chip, a flash memory chip, a MRAM chip, a PRAM chip, a ReRAM chip, and/or a SRAM chip. For example, the third semiconductor chip 74 may be a logic chip such as a controller and/or a communication chip. The second semiconductor chip 72 may be electrically connected to the fifth connecting pads 64 disposed on the second package substrate 60 through second chip connecting terminals 84 provided under the second semiconductor chip 72. The third semiconductor chip 74 may be electrically connected to the fifth connecting pads 64 disposed on the second package substrate 60 through third chip connecting terminals 85 provided under the third semiconductor chip 74. The second chip connecting terminals 84 connected to the second semiconductor chip 72 may be spaced apart from each other with a distance j therebetween. The second chip connecting terminals 84 may be connected to corresponding ones of the fifth connecting pads 64 of the second package substrate 60, respectively. The third chip connecting terminals 85 connected to the third semiconductor chip 74 may be spaced apart from each other with a distance h therebetween. The third chip connecting terminals 85 may be connected to corresponding ones of the fifth connecting pads 64 of the second package substrate 60, respectively. The distance j may be different from the distance h. For example, the distance j may be greater than the distance h. The second chip connecting terminals 84 and the third chip connecting terminals 85 may be solder bumps. The second molding compound layer 86 may seal the second semiconductor chip 72 and the third semiconductor chip 74.

Figure 11:
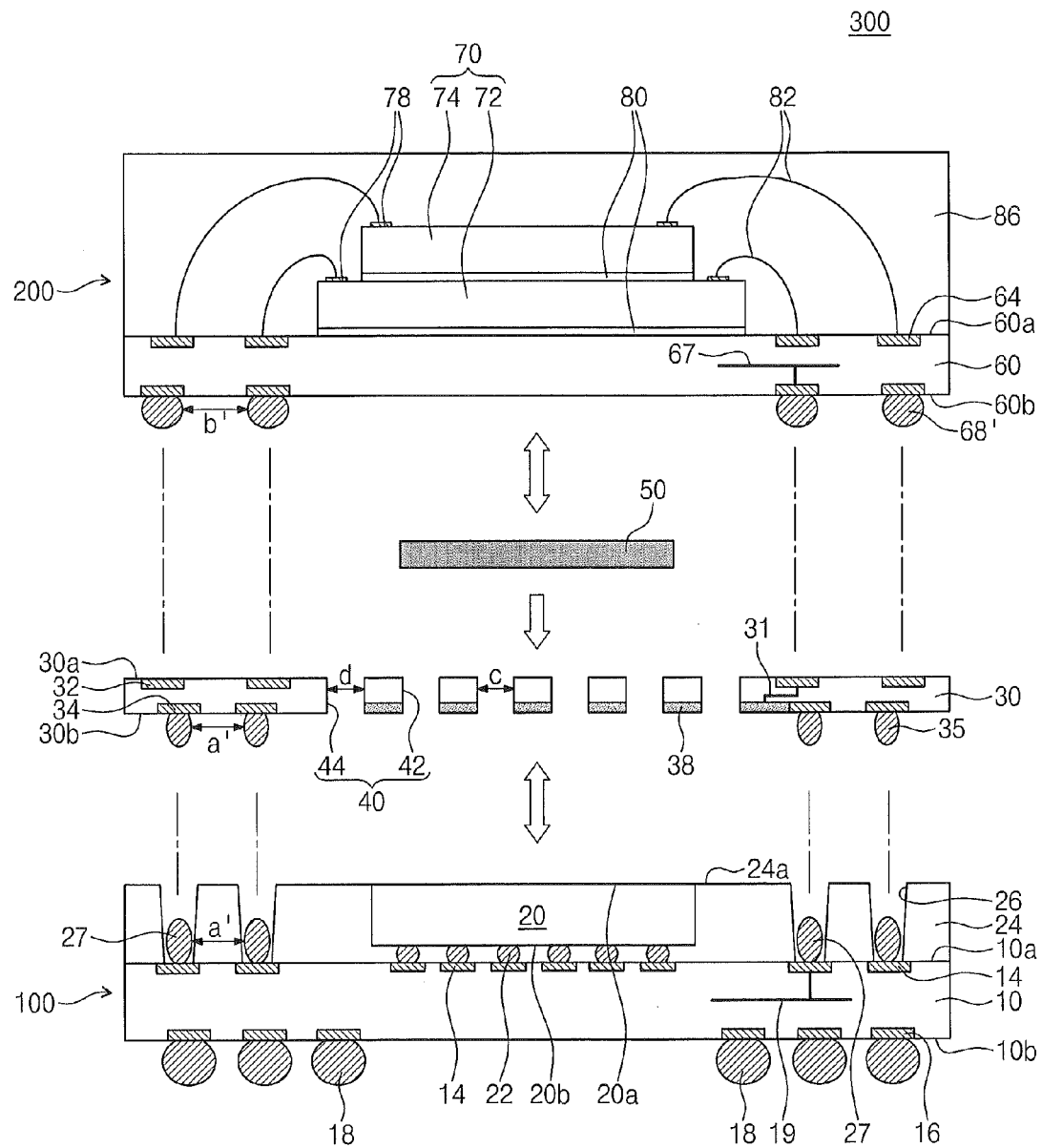
FIG. 11 is an exploded cross-sectional view illustrating a method of manufacturing a semiconductor package device according to yet still embodiments of the inventive concepts.
Figure 12:
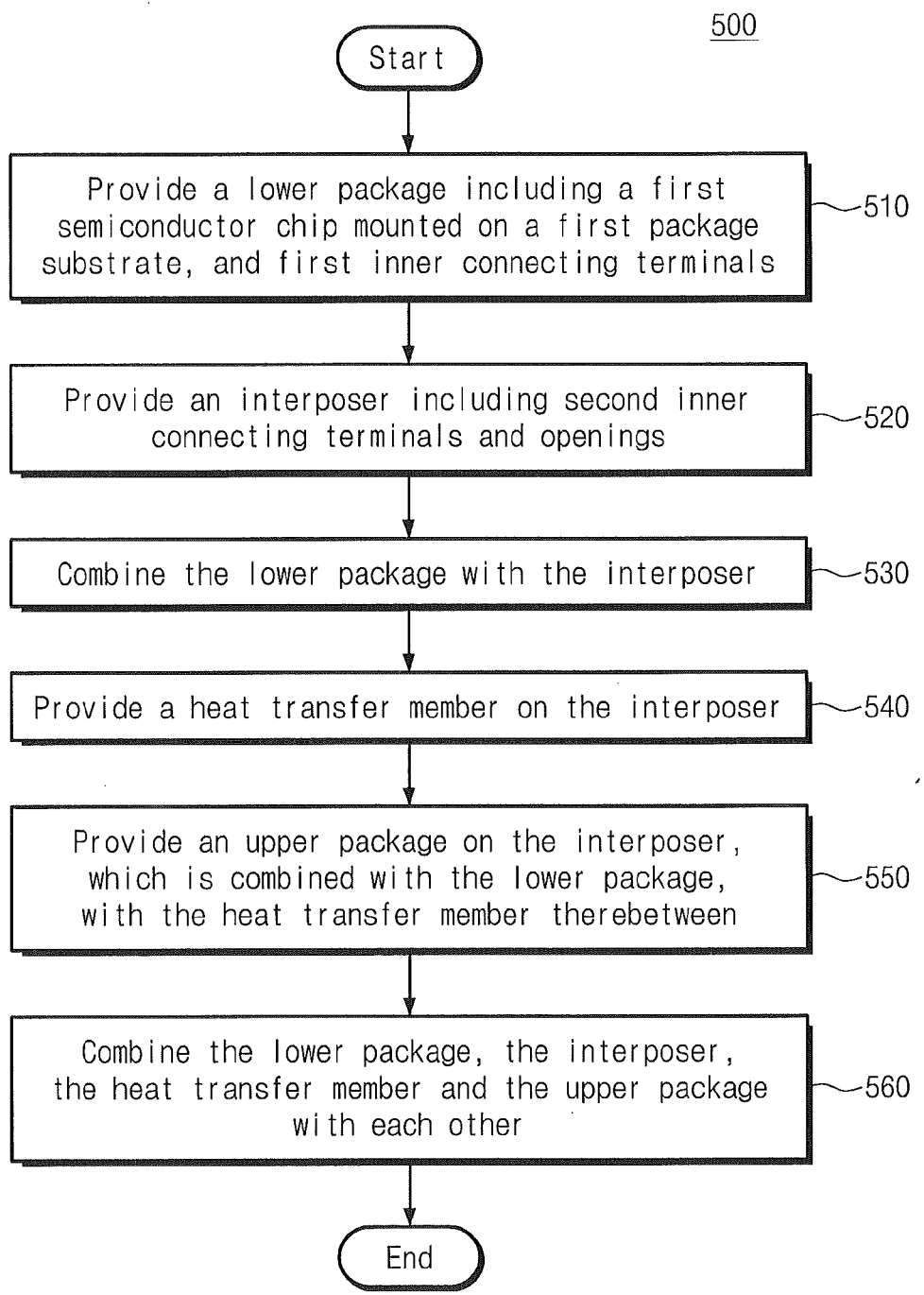
FIG. 12 is a flowchart illustrating a method of manufacturing a semiconductor package device according to yet still embodiments of the inventive concepts.

FIG. 11 is an exploded cross-sectional view illustrating a method of manufacturing a semiconductor package device according to yet still embodiments of the inventive concepts. FIG. 12 is a flowchart illustrating a method of manufacturing a semiconductor package device according to yet still embodiments of the inventive concepts.

Referring to FIGS. 11 and 12, a manufacturing method 500 of a semiconductor package device may include a process 510 of providing a lower package 100. The lower package 100 includes a first package substrate 10. The first package substrate 10 may be, for example, a printed circuit board (PCB). The first package substrate 10 may have a first surface 10a and a second surface 10b opposite to each other. The first package substrate 10 may include first connecting pads 14 formed on the first surface 10a, and second connecting pads 16 formed on the second surface 10b. The first connecting pads 14 may be electrically connected to the second connecting pads 16 through interconnections disposed within the first package substrate 10. The first package substrate 10 may include a ground layer 19. The ground layer 19 may include a metal conductive layer. For example, the ground layer 19 may include copper or a copper alloy.

External connecting terminals 18 may be formed to correspond to the second connecting pads 16, respectively. The external connecting terminals 18 may be, for example, solder balls arranged in an array form. The external connecting terminals 18 may include copper, nickel, gold, indium, bismuth, tin, and/or other non-reactive metals.

A lower semiconductor chip, i.e., a first semiconductor chip 20 may be mounted on the first package substrate 10 by a flip-chip bonding technique, so that a second surface 20b of the first semiconductor chip 20 may face the first surface 10a of the first package substrate 10. The first semiconductor chip 20 may be electrically connected to the interconnections disposed within the first package substrate 10 through first chip connecting terminals 22 and the first connecting pads 14. The second surface 20b of the first semiconductor chip 20 may be an active surface on which integrated circuits are disposed. On the other hand, a first surface 20a of the first semiconductor chip 20 may be a non-active surface on which integrated circuits are not disposed. The first chip connecting terminals 22 may be, for example, solder bumps.

For example, the first semiconductor chip 20 may be a logic device such as a microprocessor, an application processor, or a controller. However, the inventive concepts are not limited thereto.

A first molding compound layer 24 may be formed on the first surface 10a of the first package substrate 10 to seal at least a portion of a sidewall of the first semiconductor chip 20. The first molding compound layer 24 may fill a space between the second surface 20b of the first semiconductor chip 20 and the first surface 10a of the first package substrate 10. The first molding compound layer 24 may be planarized to expose the first surface 20a of the first semiconductor chip 20. Thus, a top surface 24a of the first molding compound layer 24 may be substantially coplanar with the first surface 20a of the first semiconductor chip 20. The first molding compound layer 24 may include molding via-holes 26. The molding via-holes 26 may be spaced apart from the first semiconductor chip 20. In some embodiments, portions of the first molding compound layer 24 may be removed using a laser drilled process (LDP) to form the molding via-holes 26. Alternatively, the portions of the first molding compound layer 24 may be removed using a general etching process instead of the laser drilled process (LDP) to form the molding via-holes 26. Each of the molding via-holes 26 may have an inclined sidewall profile.

First inner connecting terminals 27 may be formed in the molding via-holes 26, respectively. The first inner connecting terminals 27 may be used in order to form the first via-connecting terminals 28 illustrated in FIG. 1A in a subsequent process 530. The first inner connecting terminals 27 may be, for example, solder bumps. For example, the first inner connecting terminals 27 may include copper, nickel, gold, indium, bismuth, tin, and/or other non-reactive metals. The first inner connecting terminals 27 may be formed to respectively correspond to the first connecting pads 14 disposed around the first semiconductor chip 20 on the first package substrate 10. The first inner connecting terminals 27 may be spaced apart from each other with a distance a' therebetween and may be adjacent to a periphery of the first package substrate 10. The first inner connecting terminals 27 may be formed to be connected to the first connecting pads 14 exposed by the molding via-holes 26 after the formation of the molding via-holes 26. Alternatively, the first inner connecting terminals 27 may be formed to be connected to the first connecting pads 14 before the formation of the first molding compound layer 24, and the first inner connecting terminals 27 may be then exposed when the molding via-holes 26 are exposed.

The method 500 of manufacturing the semiconductor package device may include a process 520 of providing an interposer 30. The interposer 30 may be, for example, a printed circuit board (PCB). The interposer 30 may be a medium electrically connecting the lower package 100 to an upper package 200. The interposer 30 may include a first surface 30a and a second surface 30b opposite to each other. For example, the first surface 30a of the interposer 30 may be a top surface of the interposer 30, and the second surface 30b of the interposer 30 may be a bottom surface of the interposer 30. Third connecting pads 32 may be formed on the first surface 30a of the interposer 30, and fourth connecting pads 34 may be formed on the second surface 30b of the interposer 30. The third connecting pads 32 may be electrically connected to the fourth connecting pads 34 through interconnection disposed within the interposer 30. A distance between the third connecting pads 32 may be different from a distance between the fourth connecting pads 34. For example, the distance between the third connecting pads 32 may be greater than the distance between the fourth connecting pads 34. The third connecting pads 32 may be spaced apart from each other with a distance for corresponding to connection with second via-connecting terminals 68 of the upper package 200 in a subsequent process 550 of combining the interposer 30 with the upper package 200.

Second inner connecting terminals 35 may be formed to respectively correspond to the fourth connecting pads 34 on the second surface 30b of the interposer 30. The second inner connecting terminals 35 may be spaced apart from each other with the distance a' therebetween such that the second inner connecting terminals 35 are respectively connected to the first inner connecting terminals 27 of the lower package 100. Due to this arrangement of the second inner connecting terminals 35, the first inner connecting terminals 27 may be exactly aligned with the second inner connecting terminals 35 in the subsequent process 530 of combining the interposer 30 with the lower package 100. The second inner connecting terminals 35 may be, for example, solder bumps. For example, the second inner connecting terminals 35 may include at least one of copper, nickel, gold, indium, bismuth, tin, and other non-reactive metals.

The interposer 30 may include an opening 40. The opening 40 may include at least one first opening 42 and at least one second opening 44. The first opening 42 may be formed in a region of the interposer 30, which corresponds to the first semiconductor chip 20 of the lower package 100. In other words, the first opening 42 may be formed in an overlapping region of the interposer 30, which is aligned and overlaps with the first semiconductor chip 20 of the lower package 100. The second opening 44 may be formed to be spaced apart from the overlapping region of the interposer 30 by a predetermined distance (e.g., the distance g extending from the first semiconductor chip 20 in a direction parallel to the top surface 24a of the first molding compound layer 24). The at least one second opening 44 may surround the at least one first opening 42. The first opening 42 may be an opening having a first width c and penetrating the interposer 30. The second opening 44 may be an opening having a second width d and penetrating interposer 30. The first width c of the first opening 42 may be different from the second width d of the second opening 44. For example, the first width c of the first opening 42 may be greater than the second width d of the second opening 44. Each of the first and second openings 42 and 44 may be a through-hole or a through-slit.

A ground layer 38 may be disposed within the interposer 30. The ground layer 38 may include a metal conductive layer. For example, the ground layer 38 may include a metal such as copper or a copper alloy. The ground layer 38 may have a mesh-shape or plane-shape having a size greater than that of the first semiconductor chip 20. At least one first opening 42 may penetrate the ground layer 38. The ground layer 38 may be connected to, for example, at least one of the fourth connecting pads 34. Additionally, the ground layer 38 may be connected to at least one of the third connecting pads 32 through a connecting line 31 of the interposer 30. Thus, the ground layer 38 may be connected to both the at least one of the third connecting pads 32 and the at least one of the fourth connecting pads 34. The ground layer 38 of the interposer 30 may increase a ground area along with the ground layer 19 of the first package substrate 10 that will be combined with the interposer 30 in a subsequent process. Thus, impedance of the semiconductor package device 300 may be reduced to stably provide a power to semiconductor chips of the semiconductor package device 300. The interposer 30 may include at least one of the shapes and the arrangement of the openings illustrated in FIGS. 3A to 3H. Additionally, the interposer 30 may include at least one of the structures illustrated in FIGS. 4A, 4B, 5, 6, 7A, 7B, 7C, 8 and 9.

The method 500 of manufacturing the semiconductor package device may include a process 530 of combining the interposer 30 with the lower package 100. The interposer 30 may be aligned and disposed on the lower package 100. The second inner connecting terminals 35 of the interposer 30 are disposed to be aligned with the first inner connecting terminals 27 of the lower package 100. The second inner connecting terminals 35 of the interposer 30 may be connected to the first inner connecting terminals 27 in the molding via-holes 26 of the lower package 100, respectively. The connected first and second inner connecting terminals 27 and 35 may be combined with each other by a reflow process, thereby forming the first via-connecting terminals 28 illustrated in FIG. 1A. At this time, a gap or space may be generated between the lower package 100 and the interposer 30.

The method 500 of manufacturing the semiconductor package device may include a process 540 of providing a heat transfer member 50 on the interposer 30. The heat transfer member 50 may be dispensed on the interposer 30 in a liquid state. For example, the heat transfer member 50 may be dispensed on the region where the first opening 42 is formed. At this time, since the heat transfer member 50 has fluidity, the heat transfer member 50 may flow into at least one first opening 42 of the openings 40 of the interposer 30 as well as on the first surface 30a of the interposer 30. The heat transfer member 50 in the first opening 42 may further flow into a space between the first semiconductor chip 20 and the interposer 30, so as to be connected to the first surface 20a of the first semiconductor chip 20. Thereafter, the heat transfer member 50 may be solidified by a heating process. The solidified heat transfer member 50 may include a first portion 50a disposed on the interposer 30, a second portion 50b disposed in the at least one opening 40 of the interposer 30, and a third portion 50c disposed in the space between the interposer 30 and the lower package 100 (e.g., the space between the second surface 30b of the interposer 30 and the first surface 20a of the first semiconductor chip 20). The at least one opening 40 of the interposer 30 may reduce or prevent the heat transfer member 50 from flowing to the third connecting pad 32. As a result, it is possible to reduce or prevent the third connecting pad 32 from not being combined with a third inner connecting terminal 68' of the upper package 200 by contamination of the heat transfer member in a subsequent process of combining the upper package 200 with the interposer 30, or it is possible to reduce or prevent an electrical short between the third connecting pads 32 by the contamination of the heat transfer member. Thus, the second via-connecting terminals 68 of FIG. 1A may be easily formed to improve reliability of the semiconductor package device 300.

The heat transfer member 50 may be formed of a conductive or non-conductive thermal interface material (TIM). For example, the TIM may be a material formed by mixing a resin material with a thermal conductive filler. For example, the resin material may be an addition curable silicone composition. For example, the thermal conductive filler may be particles or powder of a conductive material (e.g., silver (Ag) and/or aluminum (Al)), and/or particles and/or powder of a non-conductive material (e.g., aluminum oxide ($Al_2O_3$) and/or silicon dioxide ($SiO_2$)). The heat transfer member 50 may have an adhesive function.

The heat transfer member 50 may be connected to the ground layer 38 of the interposer 30. Thus, if the heat transfer member 50 includes a material having conductivity, an area of the ground layer of the semiconductor package device 300 may further expand to increase the stability of the supply of the power voltage.

The method 500 of manufacturing the semiconductor package device may include a process 550 of providing the upper package 200 on the interposer 30 with the heat transfer member 50 therebetween. The upper package 200 may be provided on the interposer 30 on which the heat transfer member 50 is disposed. The upper package 200 may include a second package substrate 60. The second package substrate 60 may be, for example, a printed circuit board (PCB). The second package substrate 60 may include a first surface 60a and a second surface 60b opposite to each other. In other words, the first surface 60a and the second surface 60b of the second package substrate 60 may be a top surface and a bottom surface of the second package substrate 60, respectively. Fifth connecting pads 64 may be disposed on the first surface 60a of the second package substrate 60, and sixth connecting pads 66 may be disposed on the second surface 60b of the second package substrate 60. The fifth connecting pads 64 may be electrically connected to corresponding bonding wires 82, respectively. The sixth connecting pads 66 may be connected to corresponding third inner connecting terminals 68', respectively. The third inner connecting terminals 68' may be, for example, solder bumps. For example, the third inner connecting terminals 68' may include at least one of copper, nickel, gold, indium, bismuth, tin, and other non-reactive metals. At least one upper semiconductor chip 70 may be mounted on the second package substrate 60. For example, a second semiconductor chip 72 and a third semiconductor chip 74 may be stacked to be mounted on the second package substrate 60. The second semiconductor chip 72 or the third semiconductor chip 74 may include, for example, a memory chip such as a DRAM chip, a flash memory chip, a MRAM chip, a PRAM chip, a ReRAM chip, and/or a SRAM chip. Each of the first and second semiconductor chips 72 and 74 may be electrically connected to the fifth connecting pads 64 disposed on the second package substrate 60 through the bonding wires 82 connected to chip pads 78 disposed on a top surface of each of the first and second semiconductor chips 72 and 74. The second semiconductor chip 72 may be bonded to the second package substrate 60 by an adhesive 80, and the third semiconductor chip 74 may be bonded to the second semiconductor chip 72 by an adhesive 80.

On the other hand, as illustrated in FIG. 10, the second semiconductor chip 72 and the third semiconductor chip 74 may be mounted in parallel on the second package substrate 60 by a flip chip bonding technique. The second semiconductor chip 72 may be, for example, a memory chip such as a DRAM chip, a flash memory chip, a MRAM chip, a PRAM chip, a ReRAM chip, or a SRAM chip. The third semiconductor chip 74 may be, for example, a logic chip such as a controller and/or a communication chip. The second semiconductor chip 72 may include one chip or at least two stacked chips. The second semiconductor chip 72 may be electrically connected to the fifth connecting pads 64 disposed on the second package substrate 60 through second chip connecting terminals 84 provided under the second semiconductor chip 72. The third semiconductor chip 74 may be electrically connected to the fifth connecting pads 64 disposed on the second package substrate 60 through third chip connecting terminals 85 provided under the third semiconductor chip 74. The second chip connecting terminals 84 connected to the second semiconductor chip 72 may be spaced apart from each other with a distance j therebetween and may be connected to corresponding ones of the fifth connecting pads 64 of the second package substrate 60, respectively. The third chip connecting terminals 85 connected to the third semiconductor chip 74 may be spaced apart from each other with a distance h therebetween and may be connected to corresponding ones of the fifth connecting pads 64 of the second package substrate 60, respectively. The distance j may be different from the distance h. For example, the distance j may be greater than the distance h. The second chip connecting terminals 84 and the third chip connecting terminals 85 may be solder bumps.

A second molding compound layer 86 may be disposed on the first surface 60a of the second package substrate 60 to seal the second semiconductor chip 72 and the third semiconductor chip 74. The fifth connecting pads 64 and the sixth connecting pads 66 of the second package substrate 60 may be electrically connected to each other through interconnections disposed within the second package substrate 60. The second package substrate 60 may include a ground layer 67. The ground layer 67 may include a metal conductive layer. The ground layer 67 may include, for example, copper and/or a copper alloy.

The method 500 of manufacturing the semiconductor package device may include a process 560 of combining the lower package 100, the interposer 30, the heat transfer member 50 and the upper package 200 with each other. The upper package 200 may be disposed to be aligned on the interposer 30 that is combined with the lower package 100 and is provided with the heat transfer member 50. For example, the third inner connecting terminals 68' of the upper package 200 may be aligned with and then connected to the third connecting pads 32 of the interposer 30, respectively. The third inner connecting terminals 68' may be reflowed to enhance adhesive strength between the third inner connecting terminals 68' and the third connecting pads 32, thereby forming the second via-connecting terminals 68 electrically connecting the upper package 200 to the interposer 30 in FIG. 1A. At this time, the heat transfer member 50 may not be solidified in the process 540 but may be heated to be solidified during the reflow process of the third inner connecting terminals 68'. When the heat transfer member 50 is heated in order to be solidified, the fluidity of the heat transfer member 50 may be increased. However, a portion of the heat transfer member 50 may be stored into the openings 40 of the interposer 30 such that the flow of the heat transfer member 50 can be interrupted. Thus, it is possible to reduce or prevent the electrical short between the second via-connecting terminals 68 or the connection failure between the second via-connecting terminals 68 and the third connecting pads 32, which is caused by the contact between the heat transfer member 50 and the second via-connecting terminals 68.

Since the upper package 200 is combined with the interposer 30 combined with the lower package 100 by the formation of the second via-connecting terminals 68, the semiconductor package device 300 illustrated in FIG. 1A may be manufactured. The semiconductor package device 300 is the package-on-package (PoP) device including the lower package 100 and the upper package 200 connected to each other through the first and second via-connecting terminals 28 and 68. The semiconductor package devices 310, 320, 330, 340, 350, 360 and 370 according to other embodiments may be manufactured by the same method as described above.

Figure 13:
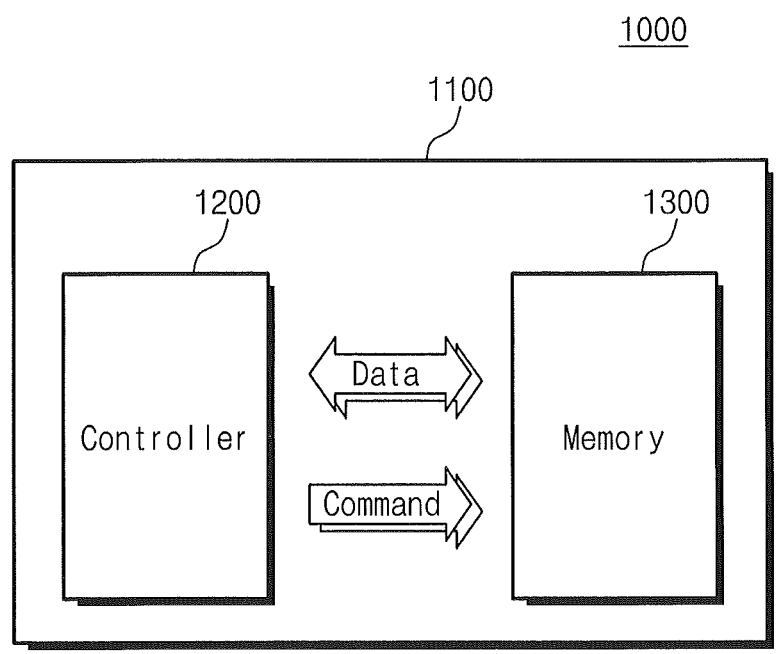
FIG. 13 is a schematic block diagram illustrating a memory system including a semiconductor package device according to some embodiments of the inventive concepts.

FIG. 13 is a schematic block diagram illustrating a memory system including a semiconductor package device according to some embodiments of the inventive concepts.

Referring to FIG. 13, a memory system 1000 according to some embodiments of the inventive concepts may be a semiconductor storage device. For example, the memory system 1000 may be a memory card and/or a solid state disk (SSD) device. The memory system 1000 may include a controller 1200 and a memory 1300 that are disposed in a housing 1100. The controller 1200 and the memory 1300 may exchange electrical signals with each other. For example, the memory 1300 and the controller 1200 may exchange data with each other in response to a command of the controller 1200. Thus, the memory system 1000 may store the data in the memory 1300 or may output the data from the memory 1300 to the outside of the memory system 1000. The controller 1200 and/or the memory 1300 may include at least one of the semiconductor package devices according to various embodiments of the inventive concepts.

Figure 14:
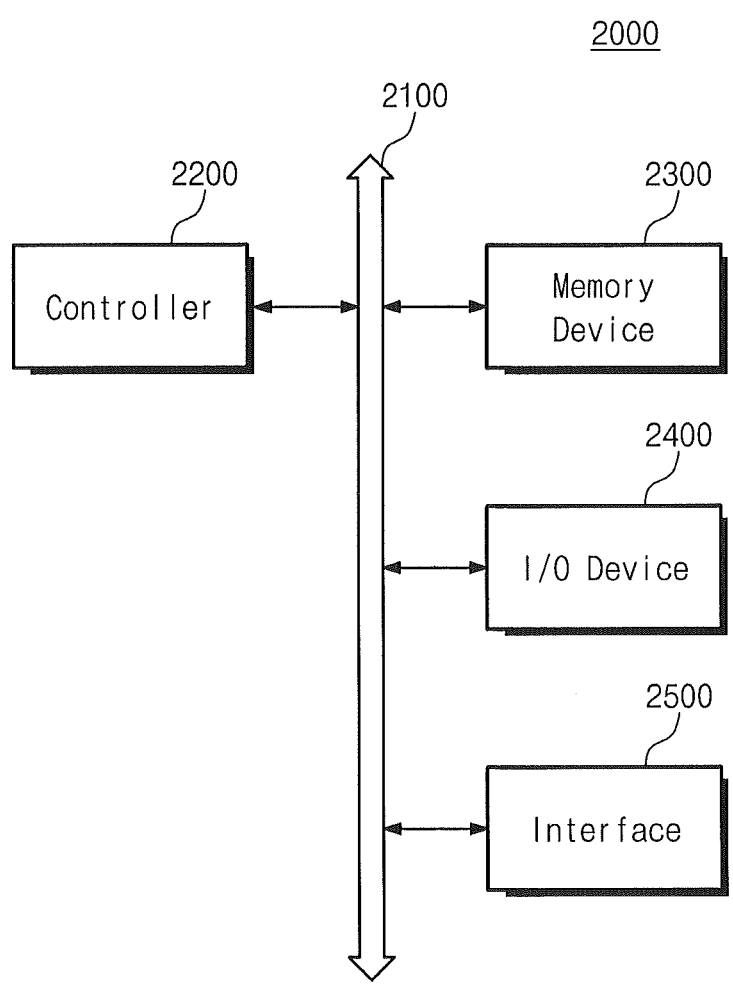
FIG. 14 is a schematic block diagram illustrating an electronic system including a semiconductor package device according to some embodiments of the inventive concepts.

FIG. 14 is a schematic block diagram illustrating an electronic system including a semiconductor package device according to some embodiments of the inventive concepts.

Referring to FIG. 14, an electronic system 2000 may include a controller 2200, a memory device 2300, and an input/output (I/O) device 2400. The controller 2200, the memory device 2300, and the I/O device 2400 may be combined with each other through a data bus 2100. The data bus 2100 may correspond to a path through which data are transmitted. For example, the controller 2200 may include a microprocessor, a digital signal processor, a microcontroller, and/or other logic device having a similar function to any one thereof. The I/O device 2409 may include a keypad, a keyboard, and/or a display device. The memory device 2300 is a device storing data. The memory device 2300 may store data and/or commands executed by the controller 2200. The memory device 2300 may include a volatile memory device and/or a non-volatile memory device. In some embodiments, the memory device may include a flash memory device. The flash memory device may be realized as a solid state disk (SSD). In this case, the electronic system 2000 may stably store massive data in the memory device 2300. The controller 2200, the memory device 2300 and/or any of the other elements of FIG. 14 may include at least one of the semiconductor package devices according to various embodiments of the inventive concepts. The electronic system 2000 may further include interface unit 2500 for transmitting data to a communication network and/or receiving data from a communication network. The interface unit 2500 may operate by wireless and/or cable. For example, the interface unit 2500 may include an antenna for wireless communication and/or a transceiver for cable communication.

The semiconductor package device according to embodiments of the inventive concepts includes the heat transfer member disposed between the interposer and the upper package, in the opening of the interposer and between the interposer and the lower package. Thus, the heat generated from the first semiconductor chip of the lower package may be transferred to the upper package such that the semiconductor package device may have the excellent heat release effect.

In the semiconductor package device according to embodiments of the inventive concepts, the opening may be formed in the interposer electrically connecting the lower package to the upper package. Thus, the heat transfer member on the interposer may flow into the opening of the interposer. As a result, it is possible to reduce or prevent the heat transfer member from flowing to the via-connecting terminals connecting the interposer to the upper package. Thus, the electrical short between the via-connecting terminals caused by the heat transfer member can be reduced or prevented to improve the reliability in transmission of the electrical signal.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package device comprising:
a lower package including a first package substrate, a first semiconductor chip on the first package substrate, and a first molding compound layer on the first package substrate;
an interposer disposed on the lower package, the interposer including at least one opening;
an upper package disposed on the interposer, the upper package including a second package substrate and a second semiconductor chip on the second package substrate;
a heat transfer member disposed between the interposer and the upper package, between the interposer and the lower package, and in the at least one opening of the interposer, the heat transfer member contacting the second package substrate and the first semiconductor chip;
first via-connecting terminals connecting the lower package to the interposer, the first via-connecting terminals spaced apart from each other with a first distance therebetween; and
second via-connecting terminals connecting the interposer to the upper package, the second via-connecting terminals spaced apart from each other with a second distance therebetween that is different from the first distance,
wherein the heat transfer member includes a different material from the first and second via-connecting terminals.

2. The semiconductor package device of claim 1, wherein the second distance of the second via-connecting terminals is greater than the first distance of the first via-connecting terminals.

3. The semiconductor package device of claim 2, wherein the first via-connecting terminals are in the first molding compound layer,
wherein the first via-connecting terminals connect the first package substrate to the interposer, and
wherein the second via-connecting terminals connect the second package substrate to the interposer.

4. The semiconductor package device of claim 1, wherein the at least one opening comprises:
at least one first opening in a first region of the interposer, which overlaps with the first semiconductor chip; and
at least one second opening in a second region of the interposer, which overlaps with the first molding compound layer.

5. The semiconductor package device of claim 4, wherein the at least one opening includes at least one of a through-hole penetrating the interposer and a through-slit penetrating the interposer.

6. The semiconductor package device of claim 5, wherein the first opening is the through-hole penetrating the interposer and the second opening is the through-slit penetrating the interposer, or
wherein each of the first and second openings is the through-slit penetrating the interposer.

7. The semiconductor package device of claim 4, wherein the at least one first opening is in a third region of the interposer, which overlaps with a heat generating circuit part of the first semiconductor chip.

8. The semiconductor package device of claim 4, wherein the first opening includes at least one concave region in the interposer, and at least one through-hole penetrating the interposer under the concave region.

9. The semiconductor package device of claim 1, wherein the upper package further comprises: a third semiconductor chip on the second package substrate; first chip connecting terminals connecting the second semiconductor chip to the second package substrate; and second chip connecting terminals connecting the third semiconductor chip to the second package substrate,
wherein the first chip connecting terminals are spaced apart from each other with a third distance therebetween, and
wherein the second chip connecting terminals are spaced apart from each other with a fourth distance different from the third distance therebetween.

10. The semiconductor package device of claim 1,
wherein the interposer includes a ground layer; and
wherein the heat transfer member is connected to the ground layer of the interposer.

11. The semiconductor package device of claim 10,
wherein the ground layer of the interposer is connected to at least one of the first via-connecting terminals.

12. The semiconductor package device of claim 10, wherein the ground layer of the interposer is connected to a ground layer of the first package substrate and/or a ground layer of the second package substrate.

13. The semiconductor package device of claim 10, wherein the at least one opening of the interposer comprises: at least one first opening and at least one second opening, and
wherein the first opening is in an overlapping region overlapping with the first semiconductor chip and the second opening is in an outer region disposed outside the overlapping region when viewed from a plan view.

14. The semiconductor package device of claim 10, wherein the at least one opening of the interposer comprises: at least one first opening and at least one second opening, and
wherein the at least one first opening is in an overlapping region overlapping with the first semiconductor chip and the at least one second opening is over both the overlapping region and a non-overlapping region outside the overlapping region at a boundary region between the overlapping region and the non-overlapping region.

15. The semiconductor package device of claim 10, wherein the at least one opening of the interposer exposes the ground layer,
wherein the heat transfer member includes a first portion disposed between the interposer and the upper package, a second portion disposed in the at least one opening of the interposer, and a third portion disposed between the interposer and the lower package, and
wherein the second portion and the third portion of the heat transfer member are separated from each other.

16. A semiconductor package device comprising:
a first package including a first package substrate;
an interposer disposed on the first package, the interposer including a ground layer and at least one opening;
a second package disposed on the interposer, the second package including a second package substrate; and
a heat transfer member including a first portion disposed between the interposer and the second package, a second portion disposed in the at least one opening of the interposer, and a third portion disposed between the interposer and the first package.

17. The semiconductor package device of claim 16, further comprising:
  first via-connecting terminals connecting the first package substrate to the interposer, the first via-connecting terminals spaced apart from each other with a first distance therebetween; and
  second via-connecting terminals connecting the second package substrate to the interposer, the second via-connecting terminals spaced apart from each other with a second distance different from the first distance therebetween,
  wherein the heat transfer member is connected to the ground layer of the interposer.

18. The semiconductor package device of claim 16, wherein the at least one opening of the interposer exposes the ground layer, and
  wherein the second portion and the third portion of the heat transfer member are separated from each other.

19. A semiconductor package device comprising:
  a first semiconductor package;
  a second semiconductor package;
  an interposer between the first and second semiconductor packages that electrically interconnects the first and second semiconductor packages, the interposer including an opening therein; and
  a flowable heat transfer member that is disposed between the interposer and the first semiconductor package and between the interposer and the second semiconductor package, the flowable heat transfer member and the opening being configured to flow some of the flowable heat transfer member into but not filling the opening.

20. The semiconductor package device of claim 19,
  wherein the interposer includes a ground layer;
  wherein the flowable heat transfer member is electrically conductive; and
  wherein the ground layer is electrically connected to the flowable heat transfer member.

21. The semiconductor package device of claim 1, wherein the heat transfer member includes a thermal interface material.

22. The semiconductor package device of claim 21, wherein the first and second via-terminals each are a solder bump.

23. The semiconductor package device of claim 1, wherein the heat transfer member is thicker than the interposer.

24. The semiconductor package device of claim 1, further comprising:
  first connection pads on a first surface of the interposer and second connection pads on a second surface of the interposer that is opposite the first surface, the first connection pads connected to the first via-terminals and the second connection pads connected to the second via-terminals,
  wherein a distance between the second connection pads is greater than a distance between the first connection pads.

* * * * *